United States Patent
Oh et al.

(10) Patent No.: US 9,777,372 B2
(45) Date of Patent: Oct. 3, 2017

(54) METHODS FOR MANUFACTURING NANO-GAP AND ANGSTROM-GAP ARTICLES

(71) Applicant: REGENTS OF THE UNIVERSITY OF MINNESOTA, Minneapolis, MN (US)

(72) Inventors: Sang-Hyun Oh, Plymouth, MN (US); Xiaoshu Chen, Minneapolis, MN (US)

(73) Assignee: REGENTS OF THE UNIVERSITY OF MINNESOTA, Minneapolis, MN (US)

(*) Notice: Subject to any disclaimer, the term of this patent is extended or adjusted under 35 U.S.C. 154(b) by 311 days.

(21) Appl. No.: 14/453,791

(22) Filed: Aug. 7, 2014

(65) Prior Publication Data

US 2015/0044428 A1 Feb. 12, 2015

Related U.S. Application Data

(60) Provisional application No. 61/863,167, filed on Aug. 7, 2013.

(51) Int. Cl.
| | |
|---|---|
| *C23C 16/40* | (2006.01) |
| *C23C 16/455* | (2006.01) |
| *G02B 5/00* | (2006.01) |
| *G02B 1/10* | (2015.01) |
| *B82Y 20/00* | (2011.01) |
| *G02B 1/14* | (2015.01) |

(52) U.S. Cl.
CPC ...... *C23C 16/45525* (2013.01); *C23C 16/403* (2013.01); *G02B 5/008* (2013.01); *B82Y 20/00* (2013.01); *G02B 1/105* (2013.01); *G02B 1/14* (2015.01); *Y10S 977/784* (2013.01); *Y10T 29/49002* (2015.01); *Y10T 428/24628* (2015.01)

(58) Field of Classification Search
CPC ........................................................ B32B 3/14
USPC .......................... 428/174; 427/123, 124, 145
See application file for complete search history.

(56) References Cited

U.S. PATENT DOCUMENTS

| | | | | |
|---|---|---|---|---|
| 5,654,222 | A * | 8/1997 | Sandhu | H01L 27/1085 257/E21.008 |
| 7,172,917 | B2 | 2/2007 | Partridge et al. | |
| 8,039,368 | B2 | 10/2011 | Drndic et al. | |
| 2009/0280648 | A1* | 11/2009 | Uzoh | H01L 21/76877 438/669 |
| 2012/0038056 | A1* | 2/2012 | Cabral, Jr. | H01L 21/31116 257/774 |

(Continued)

FOREIGN PATENT DOCUMENTS

| | | |
|---|---|---|
| WO | WO 2005/008450 A2 | 1/2005 |
| WO | WO 2006/102292 A2 | 9/2006 |
| WO | WO 2008/121445 A2 | 10/2008 |

OTHER PUBLICATIONS

Awschalom et al., *Semiconductor Spintronics and Quantum Computation*, in NanoScience and Technology, Springer-Verlag, Berlin; 2002.

(Continued)

*Primary Examiner* — Xiao Zhao
(74) *Attorney, Agent, or Firm* — Mueting, Raasch & Gebhardt, PA

(57) ABSTRACT

A method for fabricating articles for use in optics, electronics, and plasmonics includes large scale lithography or other patterning and conformal deposition such as by atomic layer deposition.

19 Claims, 19 Drawing Sheets

(56) References Cited

U.S. PATENT DOCUMENTS

2012/0161600 A1    6/2012    Norris et al.

OTHER PUBLICATIONS

Bareiβ et al., "Printed array of thin-dielectric metal-oxide-metal (MOM) tunneling diodes," *J. Appl. Phys.*, Aug. 26, 2011; 110:044316.
Barnes et al., "Surface plasmon subwavelength optics," *Nature*, Aug. 14, 2003; 424:824-830.
Beesley et al, "Sub-15-nm patterning of asymmetric metal electrodes and devices by adhesion lithography," *Nature Communications*, May 27, 2014; 5(3933).
Bharadwaj et al., "Electrical excitation of surface plasmons," *Phys. Rev. Lett.*, Jun. 2, 2011; 106:226802.
Broers, "Resolution limits for electron-beam lithography," *IBM J. Res., Develop.*, Jul. 1988; 32(4):502.
Chang, "Proximity effect in electron-beam lithography," *J. Vac. Sci. Technol. B.*, Nov./Dec. 1975; 12:1271.
000; Artech House; 852 pages.
de Waele et al., "Plasmon dispersion in coaxial waveguides from single-cavity optical transmission measurements," *Nano Lett.*, Jul. 15, 2009; 9(8):2832-2837.
Deng et al., "Single-Order, Subwavelength Resonant Nanograting as a Uniformly Hot Substrate for Surface-Enhanced Raman Spectroscopy," *Nano. Letter*, 2010; 10(5):1780-1786. Available online Apr. 23, 2010.
Ebbesen, et al., "Extraordinary optical transmission through subwavelength hole arrays," *Nature*, Feb. 12, 1998; 391:667-669.
Esteban et al., "Bridging quantum and classical plasmonics with a quantum-corrected model," *Nature Commun.*, May 8, 2012; 3: 825.
Fursina et al., "Nanogaps with very large aspect ratios for electrical measurements," *Appl. Phys. Lett.*, Mar. 17, 2008; 92:113102.
Garcia de Abajo, "Nonlocal effects in the plasmons of strongly interacting nanoparticles, dimers, and waveguides," *J. Phys. Chem. C*, Oct. 23, 2008; 112(46):17983-17987.
Garcia-Vidal et al., "Light passing through subwavelength apertures," *Rev. Mod. Phys.*, Mar. 12, 2010; 82:729-787.
Groner et al., "Electrical characterization of thin $Al_2O_3$ films grown by atomic layer deposition on silicon and various metal substrates," *Thin Solid Films*, Jun. 24, 2002; 413(1-2):186-197.
Halas et al., "Plasmons in strongly coupled metallic nanostructures," *Chem. Rev.*, 2011; 111(6):3913-3961. Available online May 4, 2011.
Houck et al., "Kondo Effect in Electromigrated Gold Break Junctions," *Nano Lett.*, 2005; 5(9):1685-1688. Available online Jul. 29, 2005.
Im et al., "Vertically oriented sub-10-nm plasmonic nanogap arrays," *Nano Lett.*, 2010; 10:2231-2236.
Johnston et al., "Parallel Fabrication of Nanogap Electrodes," *Nano Letters*, 2007; 7(9):2774-2777. Available online Aug. 16, 2007.
Kern, et al., "Atomic-scale confinement of resonant optical fields," *Nano Lett.*, Sep. 17, 2012; 12(11):5504-5509.
Kervennic et al., "Nanometer-spaced electrodes with calibrated separation," *App. Phys. Lett.*, Jan. 14, 2002; 80(2):321.
Klein et al., "An approach to electrical studies of single nanocrystals," *App. Phys. Lett*, Apr. 29, 1996; 68(18):2574.
Klein et al., "A single-electron transistor made from a cadmium selenide nanocrystal," *Nature*, Oct. 16, 1997; 389:699-701.
Koo et al., "Extraordinary magnetic field enhancement with metallic nanowire: Role of surface impedance in Babinet's principle for sub-skin-depth regime," *Phys. Rev. Lett.*, Dec. 2009; 103:263901.
Lambe et al., "Light Emission from Inelastic Electron-Tunneling," *Phys. Rev. Lett.*, Oct. 4, 1976; 37:923-925.
Lee, "Fabrication of the Funnel-Shaped Three-Dimensional Plasmonic Tip Arrays by Directional Photofluidization Lithography," *ACS Nano*, Nov. 22, 2010; 4(12):7175-7184.
Lee et al., "Switching terahertz waves with gate-controlled active graphene metamaterials," *Nature Mater.*, Sep. 30, 2012; 11:936-941.
Lindquist et al., "Engineering metallic nanostructures for plasmonics and nanophotonics," *Rep. Prog. Phys.*, Mar. 2012; 75(3):036501.
Liu et al., "Terahertz-field-induced insulator-to-metal transition in vanadium dioxide metamaterial," *Nature*, Jul. 19, 2012; 487:345-348.
Maier et al., "Local detection of electromagnetic energy transport below the diffraction limit in metal nanoparticle plasmon waveguides," *Nature Mater.*, 2003; 2:229-232. Available online Mar. 2, 2003.
Michaels et al., "Ag nanocrystal junctions as the site for surface enhanced Raman scattering of single Rhodamine 6G molecules," *J. Phys. Chem. B*, 2000; 104(50):11965-11971. Available online Nov. 23, 2000.
Miyazaki et al., "Squeezing visible light waves into a 3-nm-thick and 55-nm-long plasmon cavity," *Phys. Rev. Lett.*, Mar. 7, 2006; 96:097401.
Molzen et al., "Materials and techniques used in nanostructure fabrication," *J. Vac. Sci. Technol.*, Mar./Apr. 1979; 16(2):269.
Morpurgo et al., "Controlled fabrication of metallic electrodes with atomic separation," *App. Phys. Lett.*, Apr. 5, 1999; 74(14):2084-2086.
Na et al., "Nano encapsulation and Stabilization of Single-Molecule/Particle Electronic Nano-assemblies Using Low-Temperature Atomic Layer Deposition," *J. Phys. Chem. C.*, Nov. 24, 2008; 112(51):20510-20517.
Ngoc et a., "Large Area Metal Nanowire Arrays with Tunable Sub-20 nm Nanogaps," *ACS Nano*, May 6, 2013; 7(6):5223-5234.
Novotny et al., "Antennas for light," *Nature Photon.*, Feb. 1, 2011; 5:83-90.
Ordal et al., "Optical properties of the metals Al, Co, Cu, Au, Fe, Pb, Ni, Pd, Pt, Ag, Ti, and W in the infrared and far infrared," *Appl. Optics*, Apr. 1, 1983; 22:1099-1119.
Parikh et al., "Energy deposition functions in electron resist films on substrates," *J. Appl. Phys.*, Feb. 1, 1979; 50(2):1104.
Park et al., "Nano-mechanical oscillations in a single-$C_{60}$ transistor," *Nature*, Sep. 7, 2000; 407:57-60.
Park et al., "Coulomb blockade and the Kondo effect in single-atom transistors," *Nature*, Jun. 13, 2002; 417:722-725.
Pelton et al., "Metal-nanoparticle plasmonics," *Laser Photon. Rev.*, Jul. 2008; 2(3):136-159.
Pelton et al., *Introduction to metal-nanoparticle plasmonics*, John Wiley & Sons, Hoboken, NJ; 2013.
Pendry, "Transformation optics and subwavelength control of light," *Science*, Aug. 3, 2012; 337:549-552.
Porath et al., "Direct measurement of electrical transport through DNA molecules," *Nature*, Feb. 10, 2000; 403:635-638.
Reed et al., "Conductance of a Molecular Junction," *Science*, Oct. 10, 1997; 278(5336):252-254.
Savage et al., "Revealing the quantum regime in tunnelling plasmonics," *Nature*, Nov. 22, 2012; 491, 574-577.
Schuller et al., "Plasmonics for extreme light concentration and manipulation," *Nature Mater.* Feb. 19, 2010; 9:193-204.
Scott et al., "The Theory of Small-Angle Multiple Scattering of Fast Charged Particles," *Rev. Mod. Phys.*, Apr.-Jun. 1963; 35(2):231.
Sedgwick et al., "A Novel Method for Fabrication of Ultrafine Metal Lines by Electron Beams," *J. Electrochem. Soc.*, 1972; 119(12):1769-1771.
Seo et al., "Terahertz field enhancement by a metallic nano slit operating beyond the skin-depth limit," *Nature Photon.*, Feb. 22, 2009; 3:152-156.
Shu et al., "High-contrast terahertz modulator based on extraordinary transmission through a ring aperture," *Opt. Express*, Dec. 19, 2011; 19:26666-26671.
Sordan et al., "Coulomb blockade phenomena in electromigration break junctions," *App. Phys. Lett.*, Jun. 29, 2005; 87:013106.
Strachan et al., "Controlled fabrication of nanogaps in ambient environment for molecular electronics," *App. Phys. Lett.*, Jan. 21, 2005; 86:043109.

(56) References Cited

OTHER PUBLICATIONS

Taflove et al, *Computational Electrodynamics: The Finite-Difference Time-Domain Method*, Second Edition, 2000; Artech House; 852 pages.

van Exter et al., "Terahertz time-domain spectroscopy of water-vapor," *Opt. Lett.*, Oct. 15, 1989; 14:1128-1130.

Ward et al., "Electromigrated nanoscale gaps for surface-enhanced Raman spectroscopy," *Nano Lett.*, Apr. 13, 2007; 7(5):1396-1400.

Ward et al., "Optical rectification and field enhancement in a plasmonic nanogap," *Nature Nanotech.*, Sep. 19, 2010; 5:732-736.

Wu et al., "Broadband detection capability of ZnTe electro-optic field detectors," *Appl. Phys. Lett.*, Mar. 14, 1996; 68:2924-2926.

Wu et al., "Fowler-Nordheim Tunneling Induced Charge Transfer Plasmons between Nearly Touching Nanoparticles," *ACS Nano*, 2013; 7(1):707-716. Available online Dec. 5, 2012.

Xie et al., "Transmission of light through slit apertures in metallic films," *Opt. Express*, Sep. 21, 2004; 12(25):6106-6121.

Xu et al., "Surface-plasmon-enhanced optical forces in silver nanoaggregates," *Phys. Rev. Lett.*, Dec. 9, 2002; 89(24):246802.

Zandbergen et al., "Sculpting Nanoelectrodes with a Transmission Electron Beam for Electrical and Geometrical Characterization of Nanoparticles," *Nano Lett.*, Mar. 2005; 5(3):549-553. Available online Feb. 4, 2005.

Zhang et al., "Ultrastable substrates for surface-enhanced Raman spectroscopy: $Al_2O_3$ overlayers fabricated by atomic layer deposition yield improved anthrax biomarker detection," *J. Am. Chem. Soc.*, Jul. 19, 2006; 128, 10304-10309.

\* cited by examiner

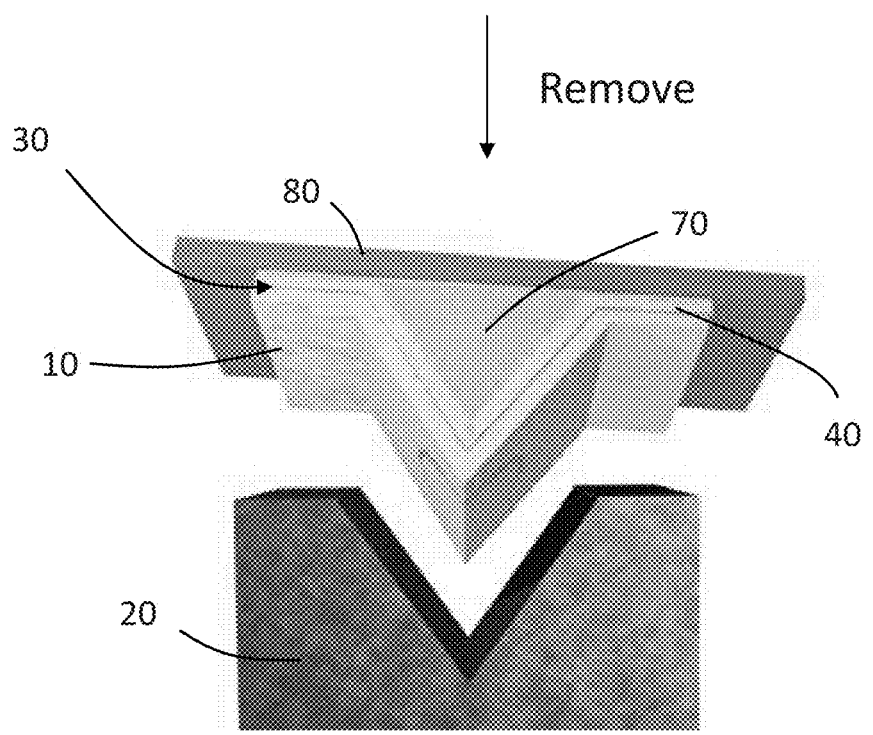
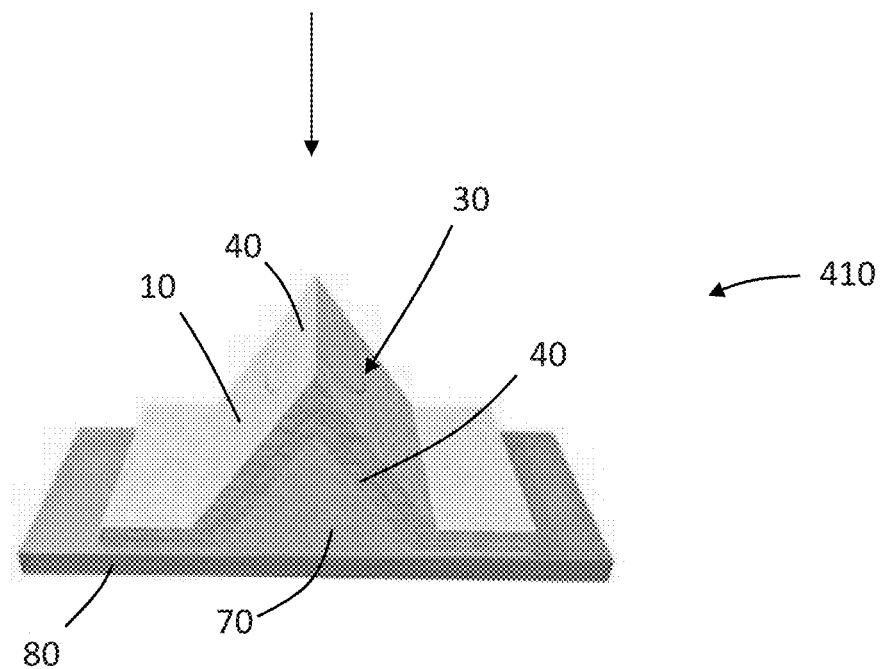
FIG. 3 (Continued)

METHODS FOR MANUFACTURING NANO-GAP AND ANGSTROM-GAP ARTICLES

RELATED APPLICATION

This application claims the benefit of U.S. Provisional Patent Application No. 61/863,167, filed on Aug. 7, 2013, which application is hereby incorporated herein by reference in its entirety to the extent that it does not conflict with the present disclosure.

FIELD

This disclosure generally relates to, among other things, articles having nanogaps, particularly articles for use in optics and electronics such as articles for use in plasmonics and nano-optics, and methods of manufacturing such articles.

BACKGROUND

Squeezing light through nanometer-wide gaps in metals can lead to extreme field enhancements, nonlocal electromagnetic effects, and light-induced electron tunneling. This intriguing regime, however, has not been readily accessible because of the lack of reliable technology to fabricate uniform nanogaps with atomic-scale resolution and high throughput.

Subwavelength confinement of optical energy has been demonstrated using metal particles, holes, slits, gaps, and tips. The greatest degree of confinement is obtained within a nanometer-scale gap between two metal surfaces. Point-like nanometric junctions have been created using aggregates of noble-metal nanoparticles, electromigration, electron-beam (e-beam) lithography, or scanning probes, but these methods are not practicable for use in fabricating devices with arbitrary geometries and Ångstrom-scale dimensions over a large area. Furthermore, the amount of light that can be coupled from free space into these point-like junctions is limited, due to size mismatch with the optical wavelength. Transmission measurements on these point-like junctions are impractical, because of the large background of light that passes by next to the junction. These challenges become even greater at longer wavelengths. In particular, squeezing infrared (IR), terahertz (THz) waves, or microwaves into nanometer-scale gaps would lead to extremely high field enhancements, but exploiting resonances at IR, THz, or microwave frequencies will require the nanogap to be extended over micrometers to centimeter length scales. However, such devices are difficult or impractical to manufacture with current techniques.

Other uses for nanoscale or Ångstrom-scale gap structures exist, such as nanogap capacitors, tunnel junctions, field emitters, electron emitters, visible/infrared/terahertz antennas and rectifiers, field-emission display devices, and the like. The manufacture of such devices and other devices having nanoscale or Ångstrom-scale gaps presents challenges with current manufacturing techniques.

SUMMARY

This disclosure describes, among other things, articles having nanoscale or Ångstrom-scale gaps between adjacent features and methods for manufacturing such articles. In many embodiments, the manufacturing methods include a step of conformal deposition of a nanoscale or Ångstrom-scale layer of first material on a patterned substrate having one or more features to form a coated pattern substrate, and a step of deposition of a second material on the coated patterned substrate such that the second material is separated from the one or more features by the nanoscale or angstrom scale thick layer of first material. The underlying substrate or a portion of the deposited second material may be removed to provide a nanogap article for use in plasmonic devices or other devices employing nanogap articles in which one material or feature is separated from another material or feature by a nanoscale or Ångstrom-scale thick layer of intermediate material.

In some embodiments described herein, a layer of material is conformally deposited on a patterned substrate. The patterned substrate has a substrate layer and a plurality of spaced apart features extending from the substrate layer and forms sides. The substrate layer is exposed between the plurality of features. The layer of material conformally deposited on patterned substrate is deposited on the plurality of spaced apart features and the exposed substrate layer to produce a coated patterned substrate. The sides of the features are coated with the material at a thickness on a nanoscale or less. A layer of a metal is deposited on the coated patterned substrate such that the deposited metal is deposited on the coated features and the coated substrate layer such that the metal is separated from one or more of the plurality of features by the coated material having the nanoscale or less thickness. The deposited metal is removed from the coated features such that the deposited metal remains on the coated substrate portion between the features.

In various embodiments described herein, a layer of material is conformally deposited on a patterned substrate. The patterned substrate has a first substrate layer and a plurality of spaced apart features extending from the substrate layer and forms sides. The substrate layer is exposed between the plurality of features. The layer of material conformally deposited on the patterned substrate is deposited on the exposed first substrate layer and the plurality of spaced apart features to produce a coated patterned substrate. The sides of the features are coated with the material at a thickness on a nanoscale or less. A layer of a metal is deposited on the coated patterned substrate such that the deposited metal is deposited on the coated features and the coated substrate layer. A second substrate is bonded to the deposited layer of metal, and the first substrate is removed from the plurality of spaced apart features, resulting in an article comprising the second substrate, the deposited layer of metal, at least a portion of the layer deposited by conformal deposition, and the plurality of spaced apart features. The second substrate is bonded to the deposited layer of metal. The layer deposited by conformal deposition is disposed between the plurality of spaced apart features and the deposited layer of metal.

In some embodiments described herein, a layer of material is deposited by conformal deposition on a patterned substrate. The patterned substrate has a first substrate layer and a feature layer disposed on the first substrate layer. The feature layer defines a void having sides extending from the substrate layer. The substrate layer is exposed through the feature layer through the void. The material that is conformally deposited on the patterned substrate is deposited on the exposed first substrate layer and the feature layer to produce a coated patterned substrate. The layer of material deposited by conformal deposition has a thickness on a nanoscale or less. A layer of a metal is deposited on the coated patterned substrate such that the deposited metal is deposited on the coated feature layer and the coated substrate layer. A second substrate is bonded to the deposited layer of metal. The first substrate is removed from the feature layer and the layer deposited on the patterned substrate by conformal deposition, resulting in an article comprising the second substrate, the deposited layer of metal, the layer deposited by conformal deposition, and the feature layer. The second substrate is bonded to the deposited layer of metal. The layer deposited by conformal deposition is in contact with a first major surface of the feature layer, is exposed along at least a portion of an opposing second major surface of the feature layer, and is disposed between the feature layer and the deposited layer of metal.

In various embodiments described herein, an article includes a substrate and a plurality of spaced apart first features formed from metal, disposed on the substrate, extending away from the substrate, and defining sides. The article further includes a nanoscale or less thick insulating layer coating the plurality of first spaced apart metal features extending from the substrate, including the sides of the plurality of first spaced apart metal features, and coating the substrate between the plurality of first spaced apart metal features. The article also includes a plurality of second spaced apart features formed from metal and disposed on the nanoscale or less thick insulating layer that is disposed on the substrate between the coated plurality of first spaced apart metal features. The plurality of second spaced apart metal features are separated from the plurality of first spaced apart metal features by the nanoscale or less thick insulating layer. The article may be an optoelectronic article, such as a plasmonic article.

In some embodiments described herein, an article includes a substrate and an adhesive disposed on the substrate. The article also includes a first metal layer bonded to the substrate by the adhesive. The first metal layer forms a plurality of features having sides. The article further includes a nanoscale or less thick insulating layer and a plurality of metal features separated from the sides of the features of the first metal layer by the nanoscale or less thick insulating layer. The article comprises a surface opposite the substrate, wherein, along the opposite surface, the plurality of second spaced apart metal features are separated from the plurality of first spaced apart metal features by the nanoscale or less thick insulating layer. The article may be an optoelectronic article, such as a plasmonic article.

In various embodiments described herein, an article includes a substrate and an adhesive disposed on the substrate. The article also includes a first metal layer bonded to the substrate by the adhesive, a second metal layer forming a void, and a nanoscale or less thick insulating layer separating the first metal layer from the second metal layer and filling the void of the second metal layer. The article comprises a surface opposite the substrate, wherein, the opposite surface is formed from the second metal layer and insulating layer filling the void. The article may be an optoelectronic article, such as a plasmonic article.

In specific embodiments described herein a patterning technology based on atomic layer deposition (ALD) is used in connection with a simple adhesive-tape-based planarization. Using this method, we create vertically-oriented gaps in opaque metal films along the entire contour of a millimeter-sized pattern, with gap widths as narrow as 9.9 Å, and pack 150,000 such devices on a 4-inch wafer. Electromagnetic waves pass exclusively through the nanogaps, enabling background-free transmission measurements. We observe resonant transmission of near-infrared waves through 1.1-nm-wide gaps ($\lambda/1,295$), and measure a very high effective refractive index of 17.8.

Conformal deposition processes, such as ALD, are uniquely suited for the fabrication of sub-nanometer-scale structures, since its self-saturating nature enables conformal deposition of dense, uniform films on metal surfaces with atomic-scale resolution. Previously, ALD was combined with ion milling to pattern 10-nm gaps along the perimeter of hollow micron-sized metal patterns. Since these structures were hollow, transmission measurements still suffered from high background levels; in addition, the dimensions of these structures were not suitable for THz studies. We have therefore developed a new planarization scheme to remove any hollow structures other than the nanogaps themselves. We use this technique to produce nanogap structures with thicknesses of less than 1 nm in opaque metal films. Furthermore, the resulting nanogap extends uniformly along a millimeter-scale loop or along larger scale shapes or lines, allowing us to exploit strong THz resonances.

BRIEF DESCRIPTION OF THE DRAWINGS

FIG. 7I is half of a Si wafer is planarized using adhesive tape (inset), creating a wafer-scale array of Ag plugs in a Si wafer with nanogaps.

Figure 1:
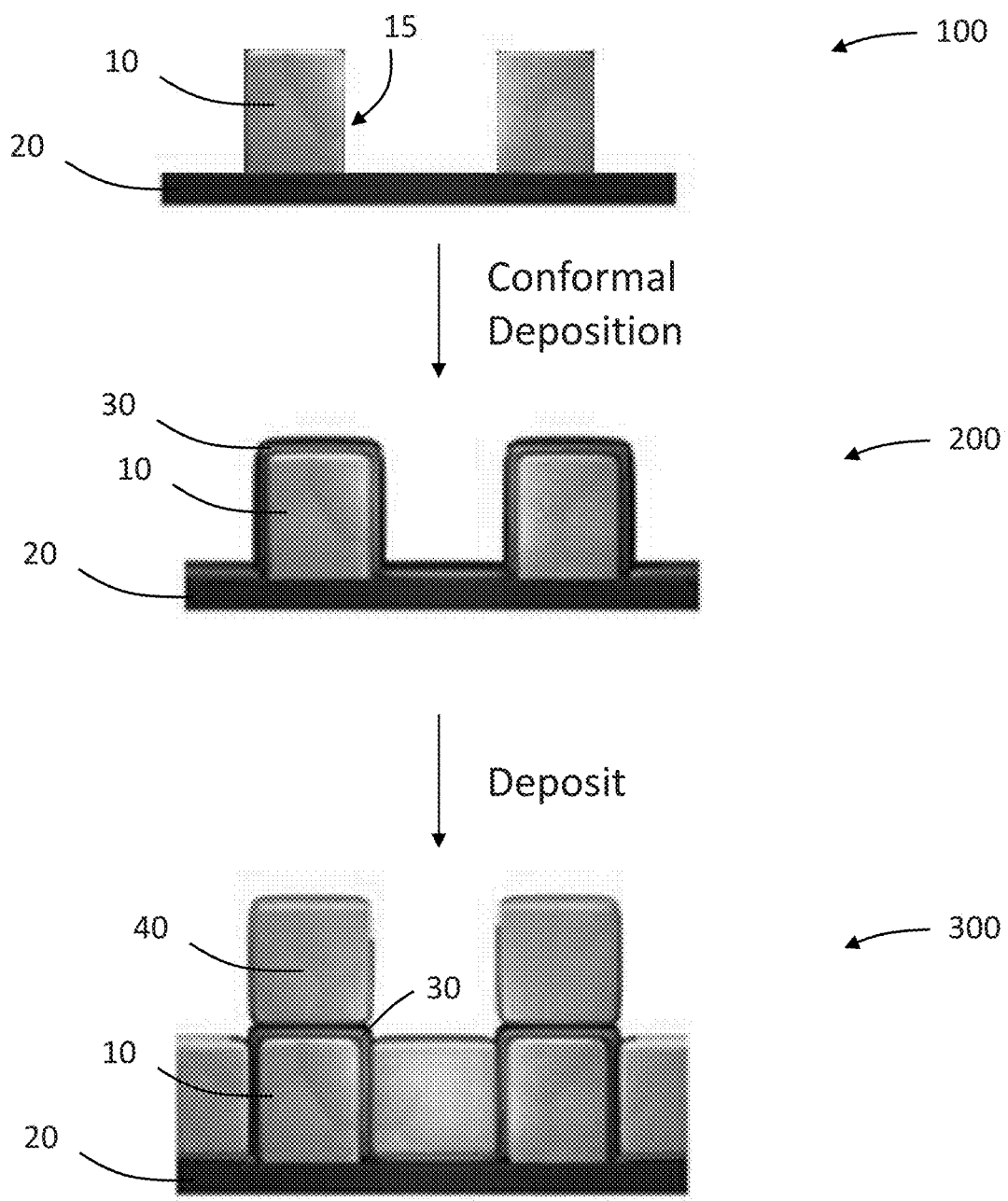
FIGS. 1-3 are schematic diagrams depicting alternative methods for fabricating articles having nanoscale or angstrom-scale gaps.
Figure 1:
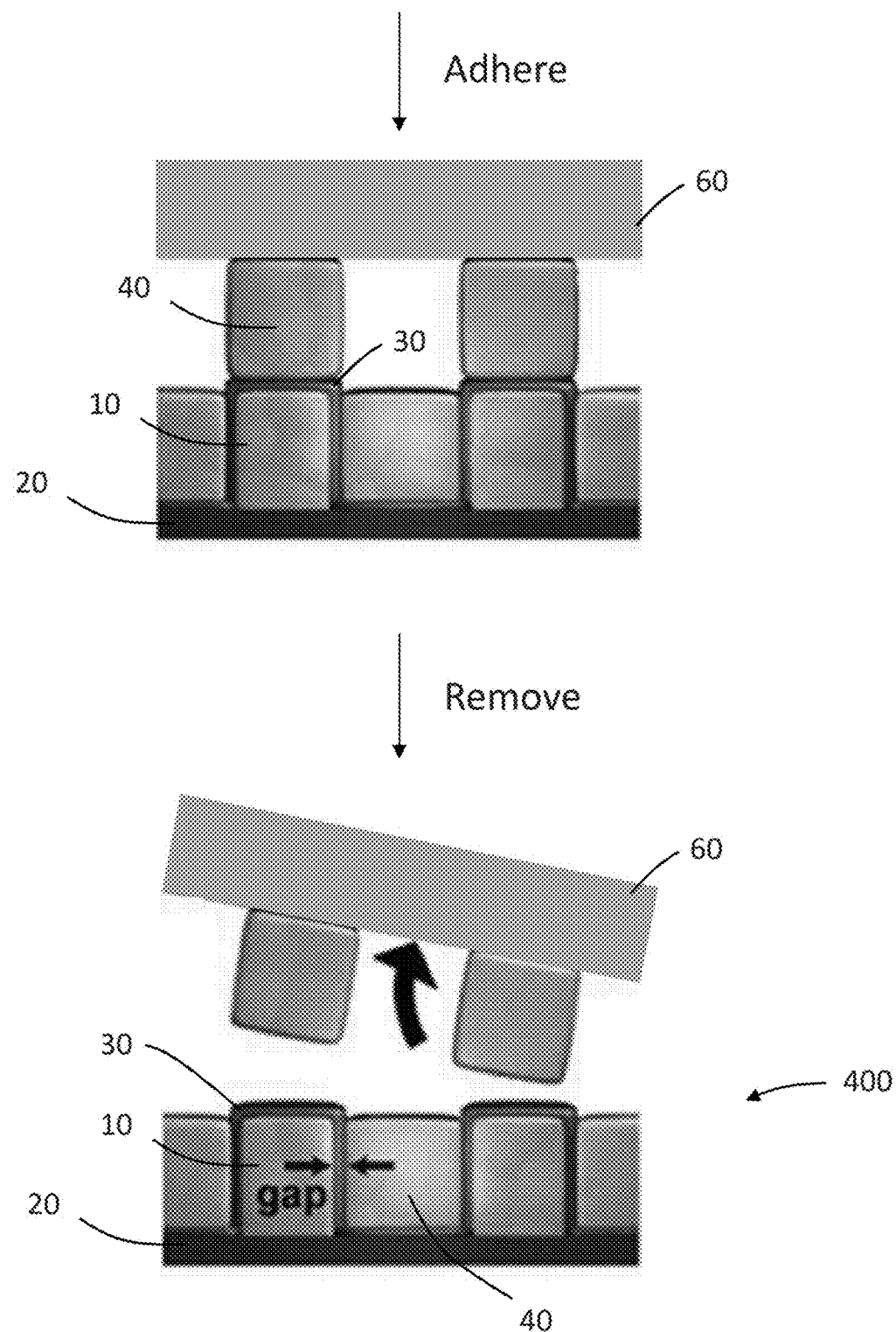

The schematic drawings are not necessarily to scale. Like numbers used in the figures refer to like components, steps and the like. However, it will be understood that the use of a number to refer to a component in a given figure is not intended to limit the component in another figure labeled with the same number. In addition, the use of different numbers to refer to components is not intended to indicate that the different numbered components cannot be the same or similar.

DETAILED DESCRIPTION

In the following detailed description several specific embodiments of articles, systems, and methods are disclosed. It is to be understood that other embodiments are contemplated and may be made without departing from the scope or spirit of the present disclosure. The following detailed description, therefore, is not to be taken in a limiting sense.

This disclosure generally relates to, inter alia, articles having nanometer-wide gaps, particularly for confinement of electromagnetic waves, and methods of manufacturing such articles. In some embodiments, the articles include a nanoscale or less thick insulating material disposed between two conductive materials or features. The space between the conductive materials or features is referred to herein as a "gap" even when insulating material is disposed in the space between the conductive materials or features. Various embodiments of the processes described herein allow for manufacture of such articles on a large scale and allow for the articles to be of nearly any suitable size. In various embodiments, the processes employ lithography or other standard patterning techniques to establish the overall size of the article, while employing conformal deposition, such as atomic layer deposition, to control the size of the nanogap with extremely high precision.

Any suitable article having nanogaps may be manufactured using the processes described herein. In some embodiments, the articles are employed for use in photonics, such as optoelectronics. Optoelectronic devices are electronic devices that source, detect, or control light. In some embodiments, the articles are employed for use in plasmonics.

Surface plasmons are electromagnetic surface waves confined to a metal-dielectric interface by coupling to free electrons in metals. Due to their evanescent nature, surface plasmon waves are not limited by the diffraction limit, and can provide confinement of light on scales much smaller than the free-space wavelength. The possibility of subwavelength confinement and control of optical fields has generated intense interest in the rapidly developing field of plasmonics and nano-optics. Because surface plasmons allow light to be concentrated in nanometer-scale volumes, surface plasmons have many applications including biosensing, data storage, photonics, and solar cells, for example. Traditionally, plasmonics has been utilized in spectroscopic techniques such as surface enhanced Raman spectroscopy, where intense local fields allow the sensitive detection of molecules. More recently, the ability to couple light to surface plasmons has been examined for reducing optical circuit elements such as waveguides, filters, switches for example, to sizes much smaller than the optical wavelength. As a result, the field of plasmonics has arisen to study how man-made metallic structures can control the generation, propagation, and manipulation of surface plasmons. Articles and devices that allow for such study or application of such phenomenon are referred herein as "plasmonic" articles or devices.

Examples of plasmonic articles include light emitting devices, surface-enhanced Raman spectroscopy devices, resonant electromagnetic wave amplification devices, detectors for infrared or terahertz waves, non-linear optical devices, antennas, devices for optical or electrical trapping of molecules or particles, and the like.

Of course, the methods described herein may be employed to manufacture any article for which two materials, which may the same or different, are separated by a nanoscale or less thick layer of material. Examples of such articles include nanogap capacitors, tunnel junctions, field emitters, electron emitters, visible/infrared/terahertz rectifiers, field-emission display devices. In some embodiments, at least one material is a semiconductor and the gap is filled with an insulator, which allows the resulting structure to be used as a field-effect transistor.

Referring now to FIG. 1, an overview of a method of manufacturing an article having nanoscale or less gaps is shown. As used herein, a gap having a "nanoscale thickness" or the like, is a gap having a thickness or width of less than about 100 nm. Preferably, the gap has a thickness or width about 10 nm or less, about 5 nm or less, about 2 nm or less, or about 1 nm. Preferably, the width is substantially uniform (e.g., varies by about 10% or less or by about 20% or less) along the length of the gap or at least the portion of the gap having a nanoscale or less thickness. The length of the uniform gap can be a millimeter or longer, 10 millimeters or longer, 100 millimeters or longer, 1 centimeter or longer, or even 10 centimeters or longer. Ångstrom scale thicknesses, which may be considered a thickness less than 1 nanometer, may also be achieved. In various embodiments, the gap has a thickness or width about 10 Ångstroms or less, about 5 Ångstroms or less, about 2 Ångstroms or less, or about 1 Ångstrom. Generally, the thickness or width will be about 1 Ångstrom or greater.

As shown in FIG. 1, a patterned substrate 100 having a substrate layer 20 and a plurality of spaced apart features 10 is provided. As used herein, "provide" with regard to "providing an article" or the like, means to manufacture, purchase, or otherwise obtain. Any suitable process may be used to fabricate a patterned substrate 100. Several methods are known for fabricating patterned substrates 100 with features 10. For example, in one method a film of material is deposited on a surface of a substrate layer 20 such as by using thermal evaporation or sputtering. After depositions the film may be patterned by lithography steps such as by using photolithography or e-beam lithography, for example. Alternatively, after deposition, ion beam etching may be used to pattern the film. Using any of these approaches, sub-micrometer features 10 can be formed in the film. Of course, other methods such as molding, embossing or imprinting may be used as appropriate based on the material employed.

The substrate layer 20 may be any suitable substrate. For example, the substrate layer 20 may be a silicon substrate or other semiconductor substrate, such as GaAs. A semiconductor substrate may be a substrate with or without doping. Insulators (such as glass, silica, sapphire) or other conductors (such as indium tin oxide) may be also be used as the substrate layer 20. The features 10 may be formed from any suitable material. In some embodiments, the features 10 are formed from conductive material. As used herein, a "conductive material" is a material that has a conductivity of about $1.5 \times 10^8$ siemens per meter or more. In some embodiments, a conductive material has a conductivity of about $1 \times 10^7$ siemens per meter or more. In some embodiments, a conductive material has a conductivity of about $1 \times 10^6$ siemens per meter or more. For optoelectronic devices such as plasmonic devices, the features 10 are preferably formed from a metal. More preferably, the features 10 are formed from a noble metal, such as ruthenium, rhodium, palladium, silver, osmium, iridium, platinum, or gold. Other metals that may be used include copper, tungsten, molybdenum, and aluminum. In some embodiments, alloys of metals, such as the metals described above, are used to form features 10. In some embodiments, the features 10 are formed from gold or silver.

As shown in FIG. 1, the features 10 have sides 15. In some embodiments, the sides 15 of the features 10 are substantially orthogonal to the substrate layer 20. Having the sides 15 orthogonal to the substrate layer 20 provides for discontinuity between first and second layers, which will be described below in more detail. As shown, the features 10 are generally rectangular. However, the features 10 may be of any other suitable shape. The features 10 and the space between the features may be of any suitable size. In the depicted embodiment, the patterned surface includes features 10 and grooves formed between the features. The grooves can have lengths in the range of tens of nanometers to hundreds of micrometers but any desired dimensions can be used.

Still referring to FIG. 1, a layer 30 of material is conformally deposited on the patterned substrate 100 to produce a coated patterned substrate 200. Any suitable deposition process that results in conformal coating may be used. As used herein, "conformal" coating or deposition, means, a coating of deposited material that conforms to the topography of the substrate that it is coating. Examples of conformal deposition that may be employed include atomic layer deposition (ALD), chemical vapor deposition (CVD), self-assembled monolayers and sputtering. One example of the use of self-assembled monolayers that may be incorporated into, or modified for incorporation into, the methods described herein is disclosed in Beesley et al, "Sub-15-nm patterning of asymmetric metal electrodes and devices by adhesion lithography," Nature Communications 5, Article No. 3933, 27 May 2014 (doi: 10.1038/ncomms4933), which publication is hereby incorporated herein by reference in its entirety to the extent that it does not conflict with the present disclosure.

Conformal coating causes the layer 30 of material to be deposited on all surfaces including the sides 15 of the features 10 and allows deposition along the entire contour of the surface. The thickness of layer 30 may be controlled by choice of deposition method (e.g., ALD, CVD, self-assembled monolayers, sputtering, electrostatic layer-by-layer assembly, etc.), deposition time, number of iterations of deposition, or the like. In some embodiments, the thickness of layer 30, which ultimately forms gaps between adjacent structures (as described in more detail below), is about 10 nm or less. In some embodiments, the thickness of layer 30 is about 5 nm or less. In some embodiments, the thickness of layer 30 is about 2 nm or less. In some embodiments, the thickness of layer 30 is about 1 nm or less. In some embodiments, the thickness of layer 30 is about 5 Ångstroms or less. In some embodiments, the thickness of layer 30 is about 2 Ångstroms or less. In some embodiments, the thickness of layer 30 is about 1 Ångstrom. ALD and self-assembled monolayers are particularly well suited for nanoscale deposition and angstrom scale deposition.

Any suitable material may be deposited by conformal deposition. For many devices, such as plasmonic devices, the material is preferably electrically insulating, such as a dielectric material. As used herein, an "electrically insulating material" is a material having a conductivity of about $1 \times 10^8$ siemens per meter or less. In some embodiments, the insulating material layer 40 conformally deposited is a metal oxide. In some embodiments, the layer 30 is formed from alumina ($Al_2O_3$), ZnO, $TiO_2$, $HfO_2$, $SiO_2$, or the like.

As shown in FIG. 1, the coated patterned substrate 200 includes layer 30 deposited on the features 10 (including sides 15) and the exposed substrate layer 20 between the features 10.

Still referring to FIG. 1, material 40 is deposited on the coated patterned substrate 200 such that the material is deposited on the coated features and the coated substrate layer such that the material 40 is separated from one or more of the plurality of features 10 by the coated material 30 having the nanoscale or less thickness. The material 40 may be deposited using any suitable process. For example, the material 40 may be deposited by an evaporation deposition process, sputtering or the like. Of course, the deposition process employed may be dependent on the material used. Preferably, an evaporation deposition process is used.

Any suitable material 40 may be deposited on the coated patterned substrate 200. The deposited material 40 may be the same or different than the material forming the features 10. By way of example, material 40 may be a conductive material. For optoelectronic devices such as plasmonic devices, material 40 is preferably a metal. More preferably, material 40 is a noble metal, such as ruthenium, rhodium, palladium, silver, osmium, iridium, platinum, or gold. Other metals that may be used include copper, tungsten, molybdenum, and aluminum. In various embodiments, material 40 is gold or silver.

Still with reference to FIG. 1, the material 40 deposited on top of the coated features 10 is removed from the coated features such that material 40 deposited on the coated substrate layer between the features remains. Any suitable method for removing the top layer of the material 40 may be used. As shown in FIG. 1, a strip 60 may be adhered or otherwise bonded to top layer of material 40 deposited on top of the coated features 10. The strip 60 with bonded or adhered material 40 may be removed by pulling or peeling away the strip 60. The strip 60 may comprise SCOTCH tape or other suitable tape. Because the adherence interaction of certain materials 40, such as noble metals, to certain layer materials 30, such as alumina, is weak, little or no residue of material 40 will remain on coated features 10 following the removal process. Of course, any other suitable process for removing the top layer of the material may be used. Non-limiting examples of suitable methods include etching, milling, polishing, and the like.

The resulting article 400 includes a substrate layer 20, spaced apart features 10, nanoscale or angstrom-scale insulating layer 30 and material 40. The features 10 extend from the substrate 10. The nanoscale or angstrom-scale insulating layer coats the features 10 (including the sides of the features) and coats the substrate 20 exposed between the features 10. Material 40 forms features disposed on the coated insulated substrate between features 10. Material 40 is separated from the features 10 by layer 30. The article 400 may be a photonic article, such as an optoelectronic article, such as a plasmonic article.

Figure 2:
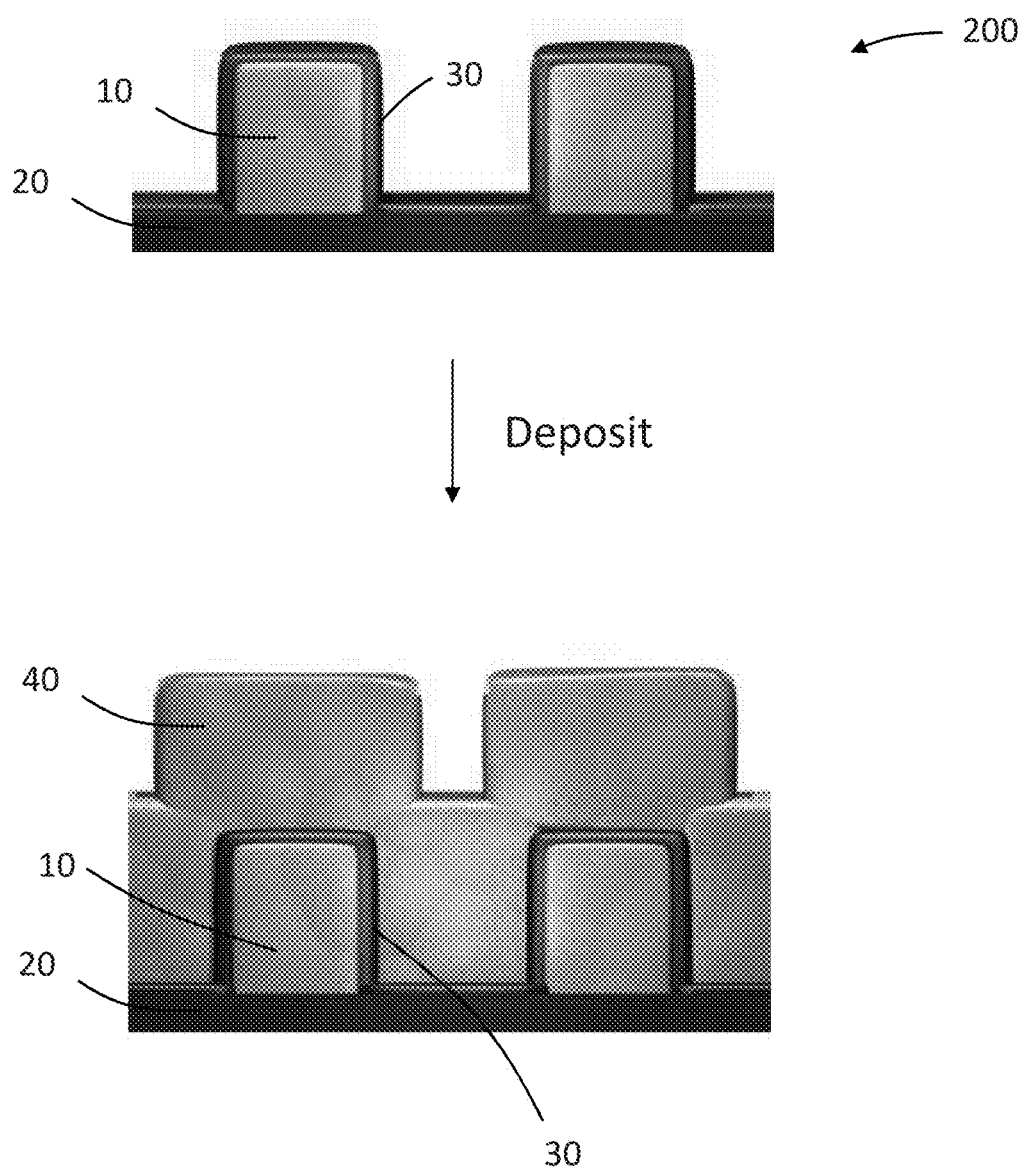
Figure 2:
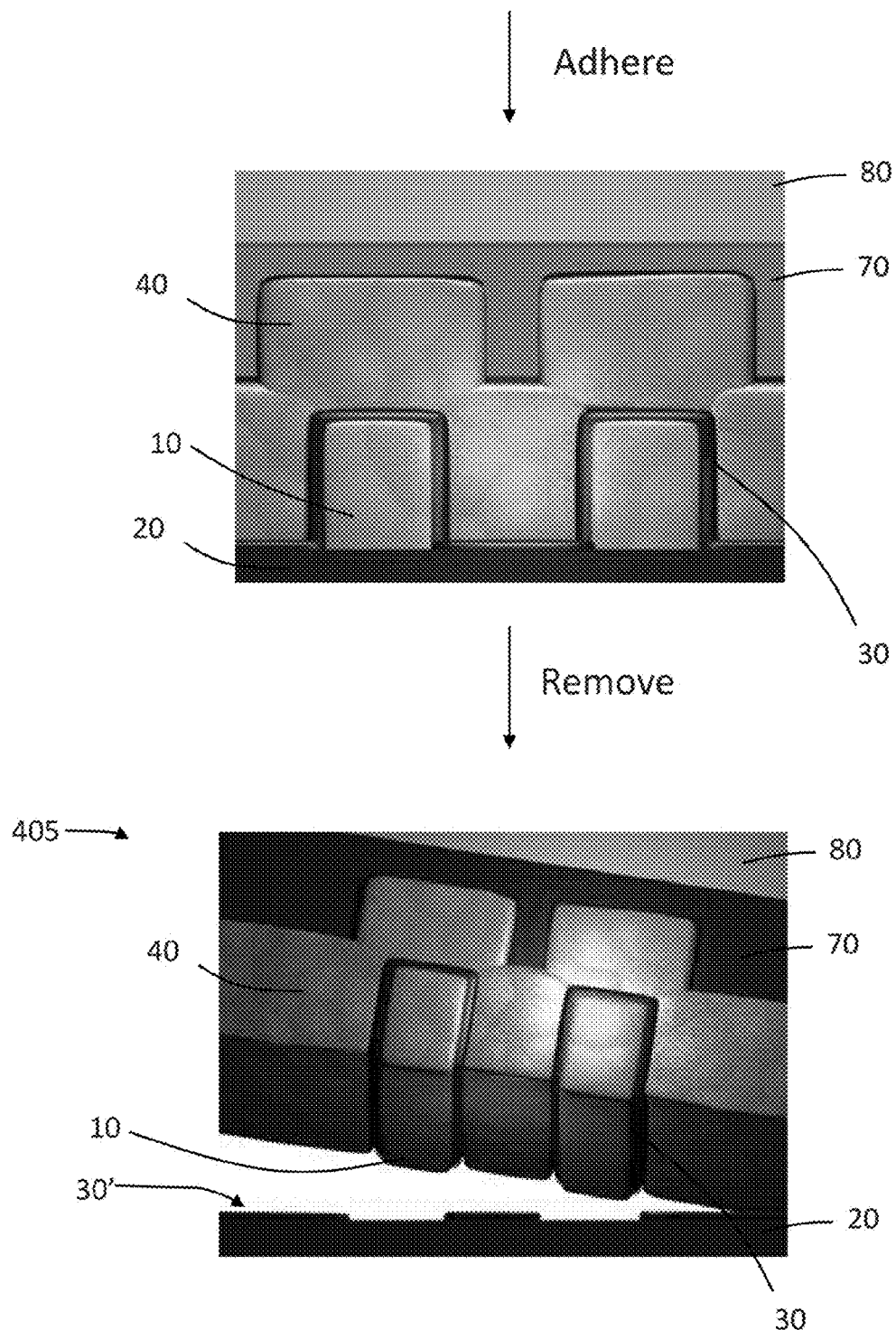

Referring now to FIG. 2, an alternative process that employs conformal deposition, such as ALD, to separate two materials by nanogaps is shown. The process depicted in FIG. 2 employs template stripping. Any suitable form of template stripping may be employed. For example, template stripping as described in, for example, U.S. Published Patent Application No. 2012/0161600, entitled "REPLICATION OF PATTERNED THIN-FILM STRUCTURES FOR USE IN PLASMONICS AND METAMATERIALS", published on Jun. 28, 2012, and naming David J. Norris et al. as an inventor (which published patent application is hereby incorporated herein by reference in its entirety to the extent that it does not conflict with the present disclosure) may be used.

As shown in FIG. 2, a material 40 is deposited on coated patterned substrate 200 (which may be fabricated as described above with regard to FIG. 1). Material 40 and coated patterned substrate 200 may be as described above (e.g., as described above with regard to FIG. 1). The material 40 may be deposited on coated patterned substrate 200 as described above with regard to FIG. 1, and the coated patterned substrate 200 and substrate layer 20, features 10, and nanoscale or angstrom-scale layer 30 of coated patterned substrate 200 may be as described above with regard to FIG. 1. As shown in FIG. 2, the thickness of material 40 may be greater than in the process shown in FIG. 1, such that material 40 deposited on the coated substrate 20 between the features 10 is integral with the material 40 deposited on top of the coated features 10.

Deposited material 40 is then bonded to a second substrate 80; e.g. via adhesive layer 70. Any suitable adhesive may be used. By way of example, adhesive may comprise resin such as 1:1 weight mixture Resin A and B of EOPTEK 377 resin from Epoxy Technologies. The second substrate 80 may be any suitable substrate, such as a glass substrate, a silicon substrate, a thin film polymer substrate or the like.

The first substrate 20 is then removed from the plurality of spaced apart features 10, leaving article 405 comprising the second substrate 80, the deposited layer of material 40, at least a portion of the layer 30 deposited by conformal deposition, and the plurality of spaced apart features 10. As depicted, a portion of the conformally deposited layer 30' in contact with the first substrate 20 may (depending at least in part in materials of layer 30, layer 40, and substrate 20) remain contacted with the substrate 20 when the substrate is removed due to greater interaction of the material of the conformally deposited layer 30' with the substrate 20 than with the deposited layer of material 40. The second substrate 80 is bonded to the deposited material 40; e.g., via adhesive layer 70. The layer 30 deposited by conformal deposition is disposed between the plurality of spaced apart features 10 and the deposited layer of material 40. Article 405 may be a photonic article, such as an optoelectronic article, such as a plasmonic article.

In the embodiment depicted in FIG. 2, the article 405 includes nanogaps formed from layer 30 that are folded. After template stripping, the entrance and exit sides of the gaps are exposed. These sites can be used for sensing and spectroscopy in a reflection mode.

Figure 3:
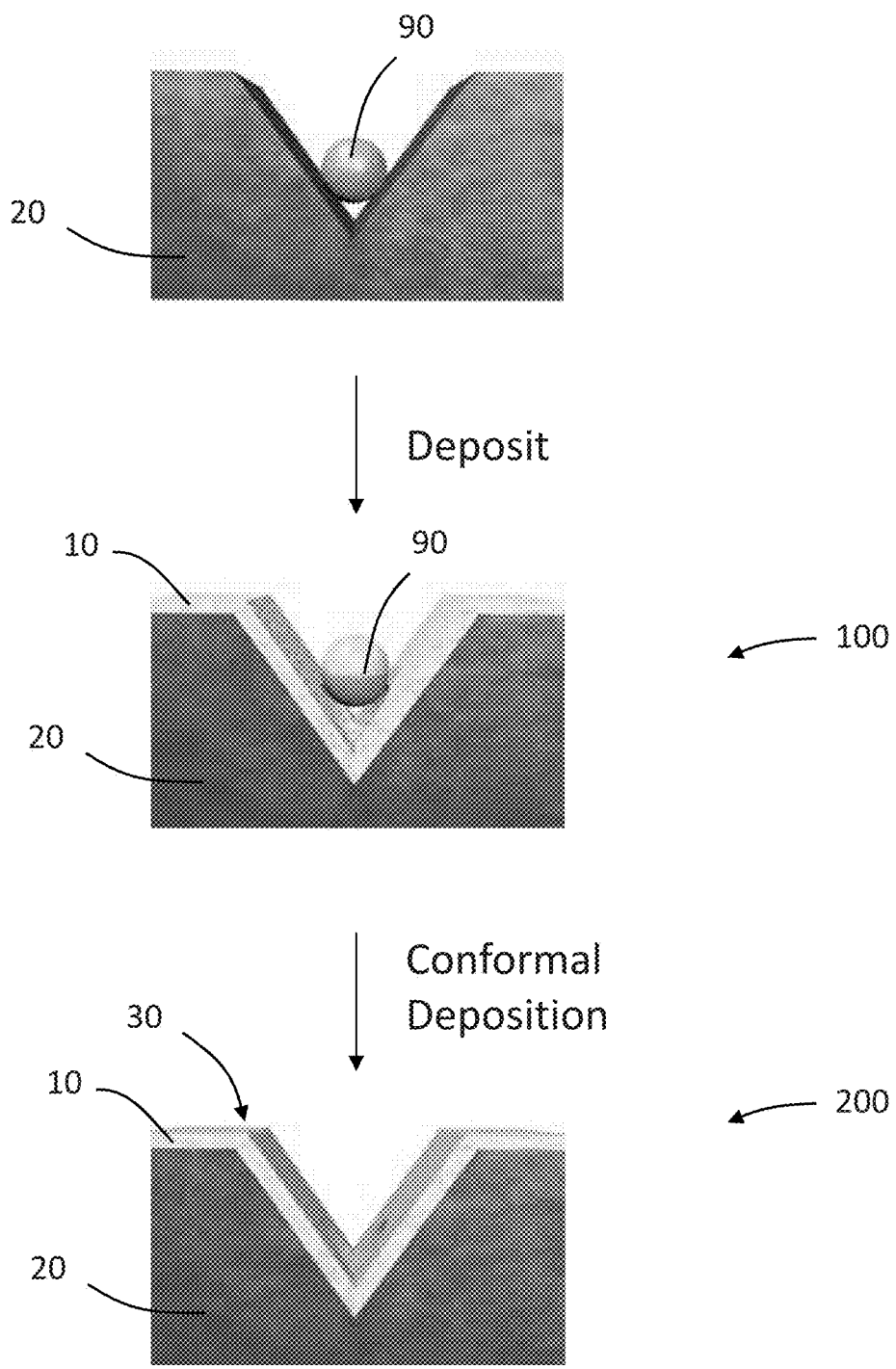
Figure 3:
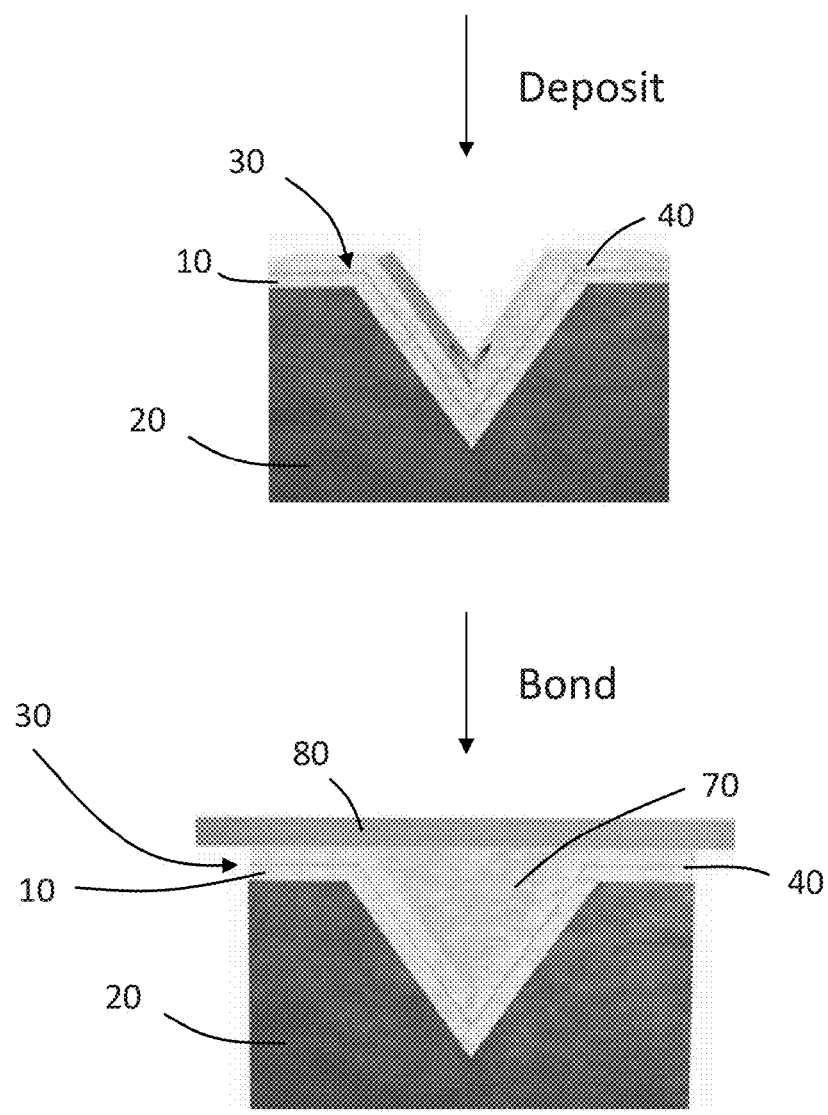

Referring now to FIG. 3, an alternative process that employs a conformal deposition process to separate two materials by nanogaps is shown. The process depicted in FIG. 3, like the process depicted in FIG. 2, employs template stripping. Many of the structures and elements shown in FIG. 3 are the same or similar to those shown in FIGS. 1-2. To the extent a structure or element in FIG. 3 is not specifically discussed with regard to FIG. 3, reference is made to the discussion above with regard to FIGS. 1-2.

As depicted in FIG. 3, a pattern etched substrate 20 is provided. A nano- or micro-scale structure, such as bead 90, is placed within an etched portion of substrate 20. A layer of material 10 is deposited on the substrate, while the bead 90 prevents portions of the surface of the substrate 20 from being coated with material 10. The resulting patterned substrate 100 has a substrate layer 20 and a feature layer 10 disposed on the substrate layer 20. The feature layer 10 defines a void (where blocked by bead) having sides extending from the substrate layer 20. The substrate layer 20 is exposed through the feature layer 10 through the void.

The bead 90 is removed and material 30 is deposited on the patterned substrate 100 to form a coated patterned substrate 200. Material 30 is deposited on the exposed substrate layer 20 and the feature layer 10. The layer of material 30 deposited by conformal deposition may have any suitable thickness, such as a thickness on a nanoscale or less.

A layer of material 40 is then deposited on the coated patterned substrate.

A second substrate 80 is bonded to the layer of material 40; e.g. via adhesive layer 70.

The first substrate 20 is removed from the feature layer 10 and the layer 30 deposited on the patterned substrate 100 by conformal deposition, resulting in an article 410 comprising the second substrate 80, the deposited layer of material 40, the layer 30 deposited by conformal deposition, and the feature layer 10. The second substrate 80 is bonded (e.g., via adhesive) to the deposited layer of material 40. The layer 30 deposited by conformal deposition is in contact with a first major surface of the feature layer 10, is exposed along at least a portion of an opposing second major surface of the feature layer 10, and is disposed between the feature layer 10 and the deposited layer of material 40.

The methods described herein may be used to make any nanogap article. As indicated above, the articles may be for use in photonic devices, optoelectrical devices, plasmonic device or other suitable devices. For example, the articles described herein may be used in light emitting devices, surface-enhanced Raman spectroscopy devices, resonant electromagnetic wave amplification devices, detectors for infrared or terahertz waves, non-linear optical devices, devices for optical or electrical trapping of molecules or particles, nanogap capacitors, tunnel junctions, field emitters, electron emitters, visible/infrared/terahertz rectifiers, field-emission display devices, and the like.

Figure 4:
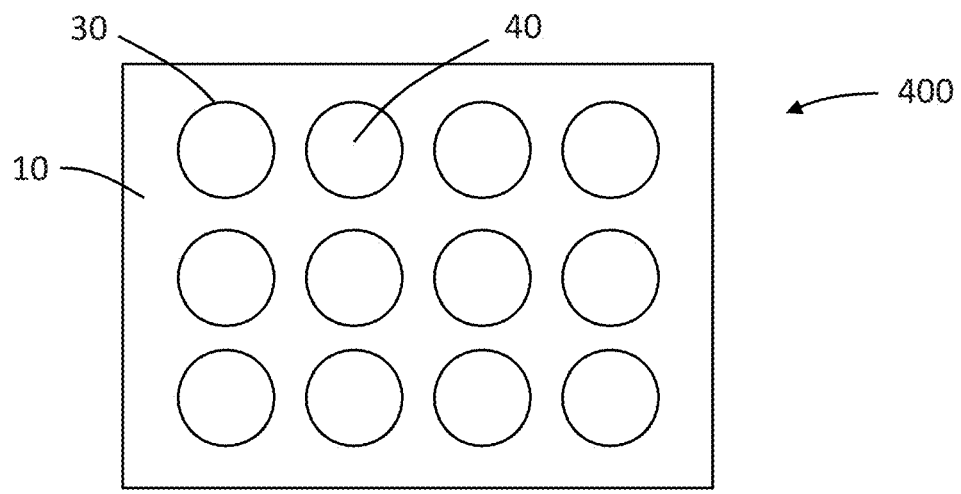
FIGS. 4-5 are schematic top views of embodiments of articles including nanogaps.
Figure 5:
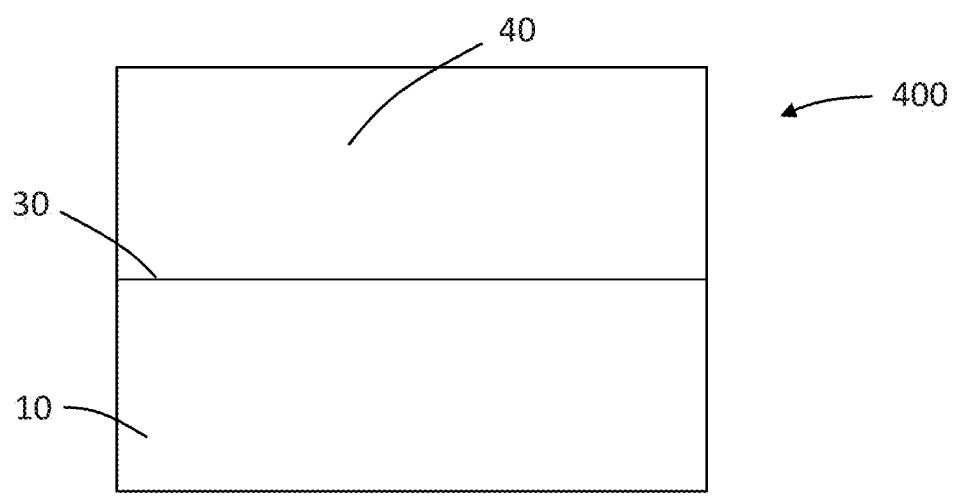

Referring now to FIGS. 4-5, schematic top views of nanogap articles 400 are shown. In FIG. 4, the article 400 includes an array of nanogaps 30 separating a first material 10 and a second material 40. Material of nanogaps 30, first material 10 and second material 40 may be as described above (e.g., with regard to FIGS. 1-3). The nanogaps 30 are in the shape of circles (or cylinders), but may be of any suitable shape. The nanogaps 30 may have any suitable length or circumference. In some embodiments, the length is 1 mm or greater. In some embodiments, the length is 1 cm or greater.

In FIG. 5, nanogap 30 separated material or feature 40 from material or feature 10. Material of nanogaps 30, first material 10 and second material 40 may be as described above (e.g., with regard to FIGS. 1-3). The nanogap 30 depicted in FIG. 5 is a linear or rectangular (or planar or rectangular prism) nanogap, but may be of any suitable shape. In some embodiments, the length of the nanogap 30 is 1 mm or greater. In some embodiments, the length of nanogap 30 is 1 cm or greater. While the article 400 depicted in FIG. 5 has only one nanogap structure, it will be understood that an article may have an array of nanogaps structures where a first material or feature is separated from a second material or feature by a material having nanoscale or less thickness.

In some embodiments, the nanogap articles are integrated with electrodes. By applying a bias, a field can be built across a nanogap, which can be used to trap micro- or nanoparticles and biomolecules. These electrically active devices can be used to build modulators, transistors, and switches. The nanogap articles can be used in connection with electrodes to study or exploit light emission and optical rectification.

Figure 6:
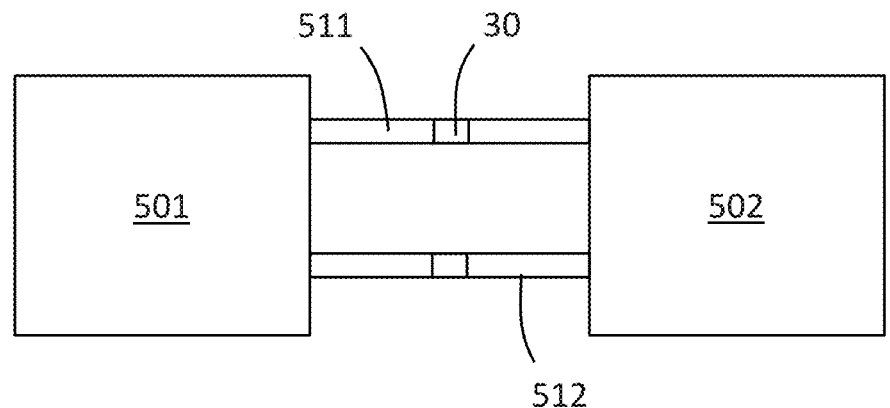
FIG. 6 is a schematic diagram of operably coupled electrodes configured to apply a bias across a nanogap.

Referring now to FIG. 6, a schematic diagram of operably coupled electrodes 501, 502 capable of forming a bias across a nanogap 30 is depicted. In the depicted embodiment, the electrodes are operably coupled via conductors 511,512.

In some embodiments, antennas, such as microwave, THz, IR, or optical antennas may be operably coupled with the nanogaps to focus and amplify energy through or across the nanogaps.

In some embodiments, the articles described herein are used such that the nanogaps serve as fluidic channels for biosensors.

In some embodiments, the nanogaps can be used as a substrate for sensing applications in the visible, IR, and terahertz range.

In some embodiments, the nanogaps may be used for thin (e.g., micron-thick or less thick) film detection in applications such as failure analysis, chemical detection, and the like. We have used nanogaps devices as described herein to detect nanometer-thin $Al_2O_3$ films at terahertz frequencies. To our knowledge, no one has demonstrated detection of 1-nm-thick films using terahertz waves. We obtained sensitivities that are about 100 to about 1000 times higher than previous reports.

A number of embodiments of articles, devices and methods have been described herein. A summary of some selected aspects of the various embodiments is presented below.

1. A method comprising:
    providing a patterned substrate having a substrate layer and a plurality of spaced apart features extending from the substrate layer and forming sides, wherein the substrate layer is exposed between the plurality of features;
    depositing a layer of material by conformal deposition on the plurality of spaced apart features and the exposed substrate layer to produce a coated patterned substrate, wherein the sides of the features are coated with the material at a thickness on a nanoscale or less;
    depositing a layer of a metal on the coated patterned substrate such that the deposited metal is deposited on the coated features and the coated substrate layer such that the metal is separated from one or more of the plurality of features by the coated material having the nanoscale or less thickness; and
    removing the deposited metal from the coated features such that the deposited metal remains on the coated substrate portion between the features.
2. The method of aspect 1, wherein depositing the material by conformal deposition comprises depositing the material as a layer having a thickness of about 10 nm or less.
3. The method of aspect 1, wherein depositing the material by conformal deposition comprises depositing the material as a layer having a thickness of about 2 nm or less.
4. The method of aspect 1, wherein depositing the material by conformal deposition comprises depositing the material as a layer having a thickness of about 5 angstroms or less.
5. The method of any one of the preceding aspects, wherein depositing the material by conformal deposition comprises depositing the material by atomic layer deposition.
6. The method of any one of the preceding aspects, wherein plurality of spaced apart features extending from the substrate layer are formed from conductive material.
7. The method of aspect 6, wherein the conductive material comprises one or more of ruthenium, rhodium, palladium, silver, osmium, iridium, platinum, gold, copper, tungsten, molybdenum, and aluminum.
8. The method of aspect 6, wherein the conductive material comprise a noble metal.
9. The method of aspect 6, wherein the conductive material consists essentially of a noble metal.
10. The method of any one of aspects 6-9, wherein the conductive material is selected from the group consisting of gold and silver.

11. The method of any one of the preceding aspects, wherein depositing the layer of material by conformal deposition comprises depositing a layer of insulating material.
12. The method of aspect 11, wherein the insulating material comprises a metal oxide.
13. The method of aspect 11, wherein the insulating material comprises $Al_2O_3$, ZnO, $TiO_2$, $HfO_2$, or $SiO_2$, or composites thereof (e.g., mixtures of different layers).
14. The method of any one of the preceding aspects, wherein depositing the layer of the metal on the coated patterned substrate comprises depositing a layer of a noble metal on the coated patterned substrate.
15. The method of aspect 14, wherein the noble metal is selected from the group consisting of gold and silver.
16. The method of any one of the preceding aspects, wherein depositing the layer of the metal on the coated patterned substrate comprises depositing the metal by a metal evaporation deposition process.
17. The method of any one of the preceding aspects, wherein removing the deposited metal from the coated features comprises: contacting the metal deposited on the coated features with an adhesive strip to adhere the metal deposited on the coated features to the adhesive strip; and peeling the metal deposited on the coated features from the coated features.
18. The method of any one of the preceding aspects, wherein the sides of the plurality of spaced apart features are substantially orthogonal to the substrate layer.
19. A method comprising:
providing a patterned substrate having a first substrate layer and a plurality of spaced apart features extending from the substrate layer and forming sides, wherein the substrate layer is exposed between the plurality of features;
depositing a layer of material by conformal deposition on the exposed first substrate layer and the plurality of spaced apart features to produce a coated patterned substrate, wherein the sides of the features are coated with the material at a thickness on a nanoscale or less;
depositing a layer of a metal on the coated patterned substrate such that the deposited metal is deposited on the coated features and the coated substrate layer;
bonding a second substrate to the deposited layer of metal; and
removing the first substrate from the plurality of spaced apart features, resulting in an article comprising the second substrate, the deposited layer of metal, at least a portion of the layer deposited by conformal deposition, and the plurality of spaced apart features, wherein the second substrate is bonded to the deposited layer of metal, and wherein the layer deposited by conformal deposition is disposed between the plurality of spaced apart features and the deposited layer of metal.
20. The method of aspect 19, wherein depositing the material by conformal deposition comprises depositing the material as a layer having a thickness of about 10 nm or less.
21. The method of aspect 19, wherein depositing the material by conformal deposition comprises depositing the material as a layer having a thickness of about 2 nm or less.
22. The method of aspect 19, wherein depositing the material by conformal deposition comprises depositing the material as a layer having a thickness of about 5 angstroms or less.
23. The method of any one of aspects 19-22, wherein depositing the material by conformal deposition comprises depositing the material by atomic layer deposition.
24. The method of any one of aspects 19-23, wherein plurality of spaced apart features extending from the substrate layer are formed from conductive material.
25. The method of aspect 22, wherein the conductive material comprises one or more of ruthenium, rhodium, palladium, silver, osmium, iridium, platinum, gold, copper, tungsten, molybdenum, and aluminum.
26. The method of aspect 22, wherein the conductive material comprise a noble metal.
27. The method of aspect 22, wherein the conductive material consists essentially of a noble metal.
28. The method of any one of aspects 22-27, wherein the conductive material is selected from the group consisting of gold and silver.
29. The method of any one of aspects 19-28, wherein depositing the layer of material by conformal deposition comprises depositing a layer of insulating material.
30. The method of aspect 29, wherein the insulating material comprises a metal oxide.
31. The method of aspect 29, wherein the insulating material comprises $Al_2O_3$, ZnO, $TiO_2$, $HfO_2$, or $SiO_2$, or composites thereof (e.g., mixtures of different layers).
32. The method of any one of aspects 19-31, wherein depositing the layer of the metal on the coated patterned substrate comprises depositing a layer of a noble metal on the coated patterned substrate.
33. The method of aspect 32, wherein the noble metal is selected from the group consisting of gold and silver.
34. The method of any one of aspects 19-33, wherein depositing the layer of the metal on the coated patterned substrate comprises depositing the metal by a metal evaporation deposition process.
35. The method of any one of aspects 19-34, wherein the sides of the plurality of spaced apart features are substantially orthogonal to the first substrate layer.
36. A method comprising:
providing a patterned substrate having a first substrate layer and a feature layer disposed on the first substrate layer, the feature layer defining a void having sides extending from the substrate layer, wherein the substrate layer is exposed through the feature layer through the void;
depositing a layer of material by conformal deposition on the exposed first substrate layer and the feature layer to produce a coated patterned substrate, wherein the layer of material deposited by conformal deposition has a thickness on a nanoscale or less;
depositing a layer of a metal on the coated patterned substrate such that the deposited metal is deposited on the coated feature layer and the coated substrate layer;
bonding a second substrate to the deposited layer of metal; and
removing the first substrate from the feature layer and the layer deposited on the patterned substrate by conformal deposition, resulting in an article comprising the second substrate, the deposited layer of metal, the layer deposited by conformal deposition, and the feature layer, wherein the second substrate is bonded to the deposited layer of metal, and wherein the layer deposited by conformal deposition is in contact with a first major surface of the feature layer, is exposed along at least a portion of an opposing second major surface of the feature layer, and is disposed between the feature layer and the deposited layer of metal.

37. The method of aspect 36, wherein depositing the material by conformal deposition comprises depositing the material as a layer having a thickness of about 10 nm or less.
38. The method of aspect 36, wherein depositing the material by conformal deposition comprises depositing the material as a layer having a thickness of about 2 nm or less.
39. The method of aspect 36, wherein depositing the material by conformal deposition comprises depositing the material as a layer having a thickness of about 5 angstroms or less.
40. The method of any one of aspects 36-39, wherein depositing the material by conformal deposition comprises depositing the material comprises depositing the material by atomic layer deposition.
41. The method of any one of aspects 36-40, wherein the feature layer is formed from conductive material.
42. The method of aspect 41, wherein the conductive material comprises one or more of ruthenium, rhodium, palladium, silver, osmium, iridium, platinum, gold, copper, tungsten, molybdenum, and aluminum.
43. The method of aspect 41, wherein the conductive material comprise a noble metal.
44. The method of aspect 41, wherein the conductive material consists essentially of a noble metal.
45. The method of any one of aspects 40-44, wherein the conductive material is selected from the group consisting of gold and silver.
46. The method of any one of aspects 36-45, wherein depositing the layer of material by conformal deposition comprises depositing a layer of insulating material.
47. The method of aspect 46, wherein the insulating material comprises a metal oxide.
48. The method of aspect 46, wherein the insulating material comprises $Al_2O_3$, ZnO, $TiO_2$, $HfO_2$, or $SiO_2$, or composites thereof (e.g., mixtures of different layers).
49. The method of any one of aspects 36-48, wherein depositing the layer of the metal on the coated patterned substrate comprises depositing a layer of a noble metal on the coated patterned substrate.
50. The method of aspect 49, wherein the noble metal is selected from the group consisting of gold and silver.
51. The method of any one of aspects 36-50, wherein depositing the layer of the metal on the coated patterned substrate comprises depositing the metal by a metal evaporation deposition process.
52. The method of any one of aspects 36-51, wherein the sides of the plurality of spaced apart features are substantially orthogonal to the first substrate layer.
53. A plasmonic article comprising:
    a substrate;
    a plurality of spaced apart first features formed from metal, disposed on the substrate, extending away from the substrate, and defining sides;
    a nanoscale or less thick insulating layer coating the plurality of first spaced apart metal features extending from the substrate, including the sides of the plurality of first spaced apart metal features, and coating the substrate between the plurality of first spaced apart metal features; and
    a plurality of second spaced apart features formed from metal and disposed on the nanoscale or less thick insulating layer that is disposed on the substrate between the coated plurality of first spaced apart metal features,
    wherein the plurality of second spaced apart metal features are separated from the plurality of first spaced apart metal features by the nanoscale or less thick insulating layer.
54. The article of aspect 53, wherein nanoscale or less thick insulating layer has a thickness of about 10 nm or less.
55. The article of aspect 53, wherein nanoscale or less thick insulating layer has a thickness of about 2 nm or less.
56. The article of aspect 53, wherein nanoscale or less thick insulating layer has a thickness of about 5 angstroms or less.
57. The article of any one of aspects 53-56, wherein plurality of spaced apart first features are formed from a noble metal.
58. The article of any one of aspects 53-57, wherein plurality of spaced apart first features are formed from a metal selected from the group consisting of gold and silver.
59. The article of any one of aspects 53-58, wherein the layer of insulating material comprises a metal oxide.
60. The article of any one of aspects 53-59, wherein the insulating material comprises $Al_2O_3$, ZnO, $TiO_2$, $HfO_2$, or $SiO_2$, or composites thereof (e.g., mixtures of different layers).
61. The article of any one of aspects 53-60, wherein plurality of spaced apart second features are formed from a noble metal.
62. The article of any one of aspects 53-61, wherein plurality of spaced apart second features are formed from a metal selected from the group consisting of gold and silver.
63. The article of any one of aspects 53-62, wherein the sides of the plurality of spaced apart first features are substantially orthogonal to the substrate layer.
64. The article of any one of aspects 53-63, wherein the article is configured for use as a light emitting device, a surface-enhanced Raman spectroscopy device, a resonant electromagnetic wave amplification device, a detector for infrared or terahertz waves, a non-linear optical device, or a device for optical or electrical trapping of molecules or particles.
65. A plasmonic article comprising:
    a substrate;
    an adhesive disposed on the substrate;
    a first metal layer bonded to the substrate by the adhesive, the first metal layer forming a plurality of features having sides;
    a nanoscale or less thick insulating layer; and
    a plurality of metal features separated from the sides of the features of the first metal layer by the nanoscale or less thick insulating layer,
    wherein the article comprises a surface opposite the substrate, wherein, along the opposite surface, the plurality of second spaced apart metal features are separated from the plurality of first spaced apart metal features by the nanoscale or less thick insulating layer.
66. The article of aspect 65, wherein nanoscale or less thick insulating layer has a thickness of about 10 nm or less.
67. The article of aspect 65, wherein nanoscale or less thick insulating layer has a thickness of about 2 nm or less.
68. The article of aspect 65, wherein nanoscale or less thick insulating layer has a thickness of about 5 angstroms or less.
69. The article of any one of aspects 65-68, wherein the first metal layer is formed from a noble metal.
70. The article of any one of aspects 65-69, wherein the first metal layer is formed from a metal selected from the group consisting of gold and silver.

71. The article of any one of aspects 65-70, wherein the layer of insulating material comprises a metal oxide.
72. The article of any one of aspects 65-71, wherein the insulating material comprises $Al_2O_3$, ZnO, $TiO_2$, $HfO_2$, or $SiO_2$, or composites thereof (e.g., mixtures of different layers).
73. The article of any one of aspects 65-72, wherein plurality of metal features are formed from a noble metal.
74. The article of any one of aspects 65-73, wherein plurality of metal features are formed from a metal selected from the group consisting of gold and silver.
75. The article of any one of aspects 65-74, wherein the sides of the plurality of features of the first metal layer are substantially orthogonal to the substrate layer.
76. The article of any one of aspects 65-75, wherein the article is configured for use as a light emitting device, a surface-enhanced Raman spectroscopy device, a resonant electromagnetic wave amplification device, a detector for infrared or terahertz waves, a non-linear optical device, or a device for optical or electrical trapping of molecules or particles.
77. A plasmonic article comprising:
    a substrate;
    an adhesive disposed on the substrate;
    a first metal layer bonded to the substrate by the adhesive;
    a second metal layer forming a void; and
    a nanoscale or less thick insulating layer separating the first metal layer from the second metal layer and filling the void of the second metal layer,
    wherein the article comprises a surface opposite the substrate, wherein, the opposite surface is formed from the second metal layer and insulating layer filling the void.
78. The article of aspect 77, wherein nanoscale or less thick insulating layer has a thickness of about 10 nm or less.
79. The article of aspect 77, wherein nanoscale or less thick insulating layer has a thickness of about 2 nm or less.
80. The article of aspect 77, wherein nanoscale or less thick insulating layer has a thickness of about 5 angstroms or less.
81. The article of any one of aspects 77-80, wherein the first metal layer is formed from a noble metal.
82. The article of any one of aspects 77-81, wherein the first metal layer is formed from a metal selected from the group consisting of gold and silver.
83. The article of any one of aspects 77-82, wherein the layer of insulating material comprises a metal oxide.
84. The article of any one of aspects 77-82, wherein the insulating material comprises $Al_2O_3$, ZnO, $TiO_2$, $HfO_2$, or $SiO_2$, or composites thereof (e.g., mixtures of different layers).
85. The article of any one of aspects 77-84, wherein the second metal layer is formed from a noble metal.
86. The article of any one of aspects 77-85, wherein second metal layer is formed from a metal selected from the group consisting of gold and silver.
87. The article of any one of aspects 77-86, wherein the article is configured for use as a light emitting device, a surface-enhanced Raman spectroscopy device, a resonant electromagnetic wave amplification device, a detector for infrared or terahertz waves, a non-linear optical device, or a device for optical or electrical trapping of molecules or particles.

Thus, various embodiments of NANO-GAP ARTICLES AND METHOD OF MANUFACTURE are disclosed. One skilled in the art will appreciate that the articles, devices and methods described herein can be practiced with embodiments other than those disclosed. The disclosed embodiments are presented for purposes of illustration and not limitation. One will also understand that components of the articles, devices and methods depicted and described with regard the figures and embodiments herein may be interchangeable.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" infusion is merely intended to differentiate from another infusion device (such as a "first" infusion). Use of "first," "second," etc. in the description above and the claims that follow is also not necessarily intended to indicate that one comes earlier in time than the other.

In the following, non-limiting examples of processes for forming plasmonic devices and testing of the devices is presented.

EXAMPLES

Example 1

A. Methods
Atomic Layer Deposition.
An $Al_2O_3$ layer was deposited by ALD at 250° C. on Au substrates, and at 50° C. on Ag substrates to avoid unwanted oxidation. Trimethylaluminum and water vapor were sequentially pulsed through the chamber with $N_2$ purging after each injection. Deposition rates were 1.1 Å per cycle on Au and 1.83 Å per cycle on Ag. The thickness of the $Al_2O_3$ film was calibrated using ellipsometry on control wafers placed in the same chamber.

Adhesive-Tape-Based Planarization.

After the ALD step and the deposition of the second metal layer, the metal film atop the substrate was removed by gently contacting the top layer with one-sided Scotch tape and peeling it off. The metal can be cleanly removed because of the poor adhesion between noble metals (Au and Ag) and $Al_2O_3$, and only the top metal film is removed, due to the height difference between the metal inside and outside the patterned area. The peeling process has been successfully performed for patterns that are as large as 0.1 cm×0.8 cm, and leaves behind no residue.

Transmission Electron Microscopy Sample Preparation.

A lamina of the $Au/Al_2O_3/Au$ structure was cut at one side of the rectangular pattern by FIB milling, was picked up using an Omniprobe, and was attached to a TEM grid. The lamina was further thinned by FIB milling to less than 100 nm for imaging by TEM (JEM-ARM200F, JEOL).

Optical Transmission Measurements.

For transmission measurements at near-infrared (NIR) wavelengths, nanogaps were illuminated with a halogen lamp, and the transmitted light was collected with an infrared objective lens and imaged on the entrance slit of an Acton SP2300 grating spectrometer equipped with a liquid-$N_2$-cooled OMA V InGaAs focal-plane photodiode array. For transmission measurements at visible wavelengths, an inverted microscope, an imaging spectrometer, and a CCD camera were used. Spectra were normalized to the illumination source, and a background spectrum was subtracted from all measured spectra. Each spectrum was measured through a single gap and averaged over the length of the gap. Repeatable spectra were obtained from different gaps on the same samples. Nanogap samples for optical transmission measurements were made using standard photolithography (except the spectrum for 2 nm gap in gold film in FIG. 8D, which was taken from a sample made using FIB).

B. Results

Wafer-Scale Atomic Layer Lithography of 1-nm-Wide Vertical Gaps

The processing scheme employed in this example is illustrated in FIG. 1, discussed above. First, trenches with the desired geometries were patterned in a substrate using standard patterning techniques. The patterned substrate was then coated conformally with $Al_2O_3$ via ALD at a typical growth rate of 1-2 Å per cycle. The trenches overcoated with the $Al_2O_3$ film were subsequently filled with metal by directional evaporation (the "plug," element 40 shown in FIG. 1). Details on the sample fabrication method are given in the Methods section.

Figure 7A:
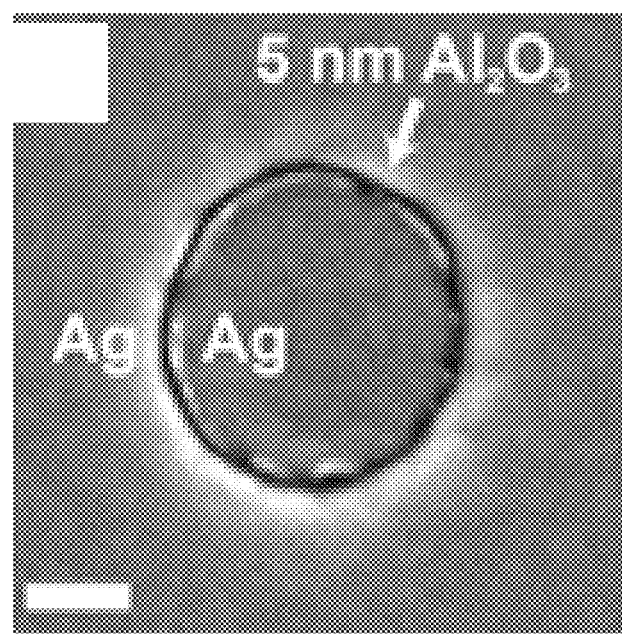
FIG. 7A is a top-view scanning electron micrograph (SEM) of a 5-nm-wide annular gap in a 200-nm thick Ag film. (Scale bars: 300 nm).
Figure 7B:
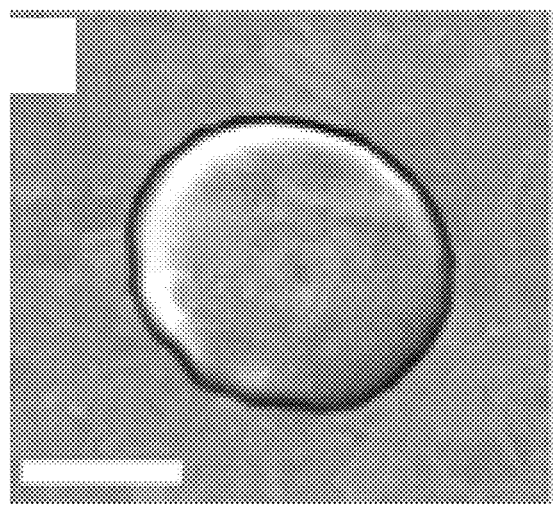
FIG. 7B is a SEM image taken from the bottom side of the structure by stripping it from the substrate. (Scale bars: 300 nm).
Figures 7C, 7D, 7E:
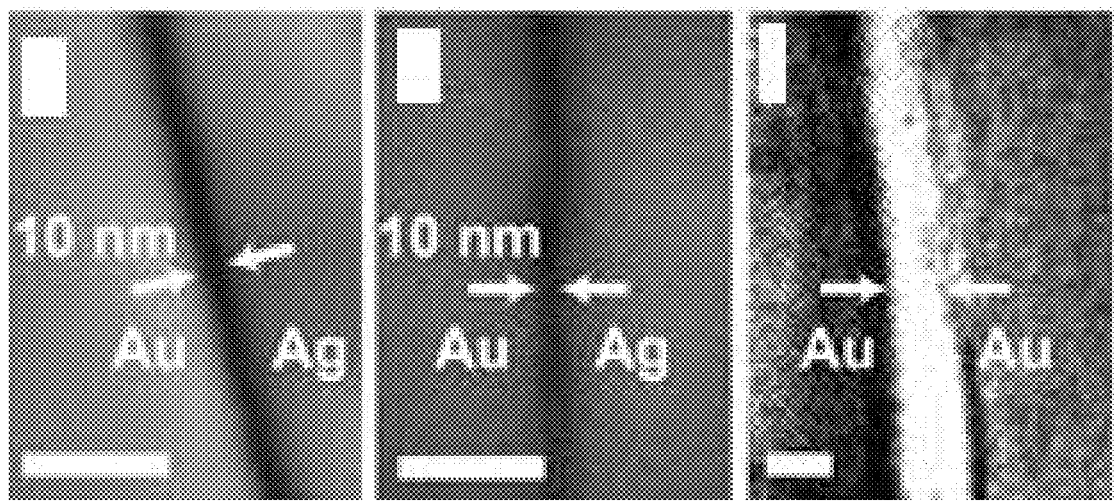
FIG. 7C is a top-view SEM of a 10-nm-wide $Al_2O_3$ layer between Ag and Au. (Scale bars: 50 nm).
FIG. 7D is a cross-sectional SEM of a 10-nm-wide $Al_2O_3$ layer between Ag and Au. (Scale bars: (50 nm).
FIG. 7E is a cross-sectional transmission electron micrograph (TEM) of a 9.9-Å-wide $Al_2O_3$ layer between two Au layers. (Scale bars: 1 nm).
Figures 7F, 7G:
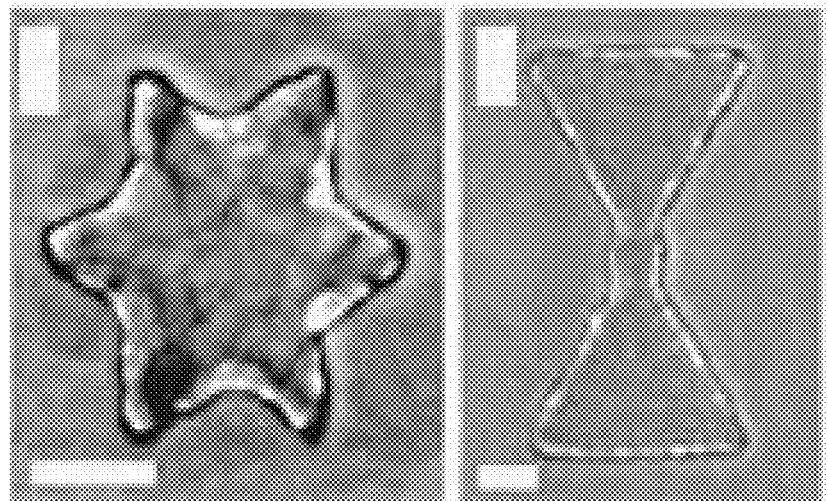
FIGS. 7F-G are colorized top-view SEM of j, Star, and k, bowtie milled with FIB in a 200 nm-thick Au film on a glass substrate. These patterns were filled with 200 nm-thick Ag plugs with 10-nm-thick $Al_2O_3$ layers in between. (Scale bars: 300 nm).
Figure 7H:
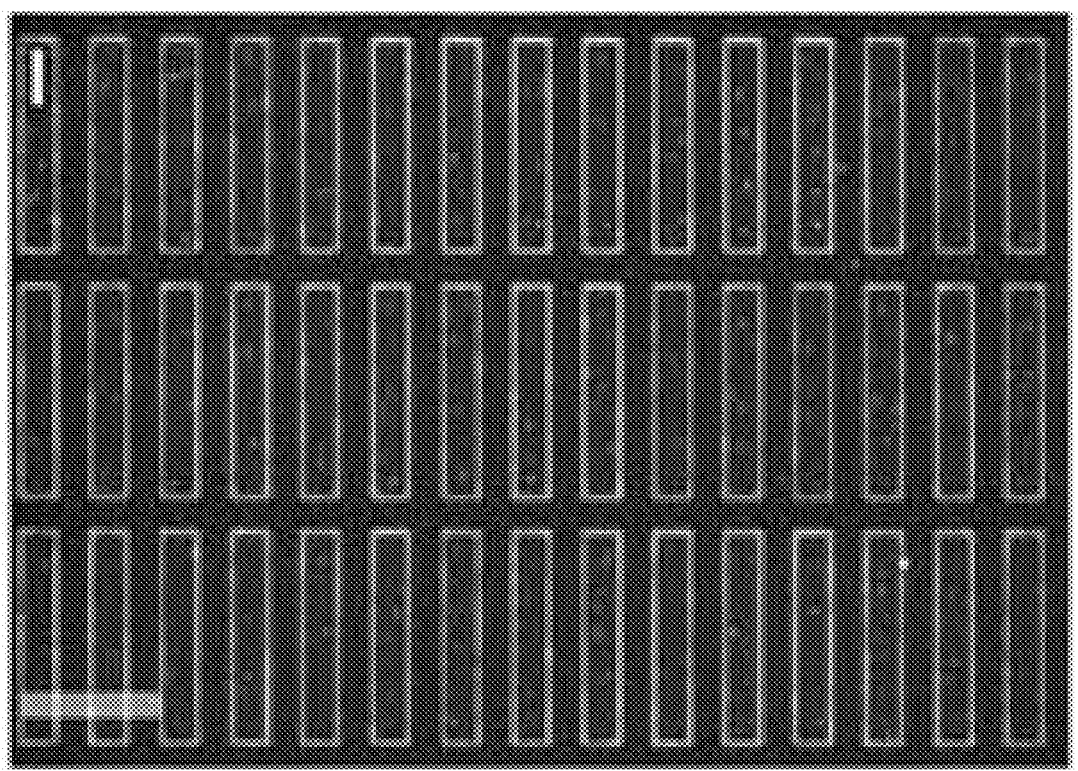
FIG. 7H is an optical micrograph of a silver nanogap sample (gap size=5 nm; metal thickness=150 nm; total ring length=0.7 mm; total image area=1.6 mm×1.0 mm). Approximately 150,000 rectangles are patterned over an entire 4-inch glass wafer using standard photolithography. (Scale bars: 0.2 mm).
Figure 71:
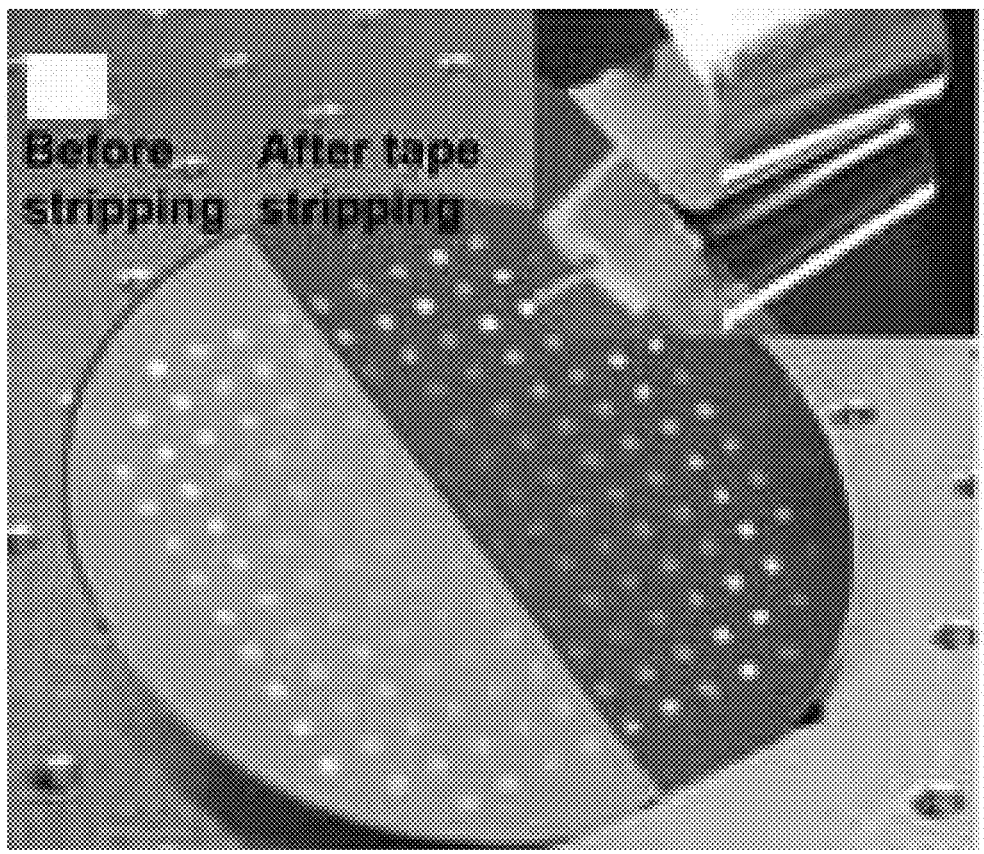

FIGS. 7A-I are scanning electron micrographs (SEM) of 5-nm-thick annular gaps formed in Ag films and a 10-nm gap formed between Au and Ag. Transmission electron microscopy (TEM) was used to verify the thickness of a 9.9-Å-thick $Al_2O_3$ layer on the sidewall of a vertical $Au/Al_2O_3/Au$ nanogap (FIG. 7E). FIGS. 7F-G demonstrate that nanogaps with aspect ratios greater than 200 can be formed along the contours of arbitrary patterns. The yield of the "plug-and-peel" process for a wafer-scale array of metal/$Al_2O_3$/metal nanogap structures (FIGS. 7H-I) is over 90%. Furthermore, even if the lateral sidewalls display some residual roughness from the initial patterning process, the conformal ALD coating ensures that the nanogaps are uniform in thickness and electrically insulating (data not shown). A particularly notable feature of our technique is that it can readily form a 1-nm-wide vertical gap along a millimeter-long loop (FIG. 7H), as required for resonant transmission of millimeter waves. Because the array of rectangles is patterned by standard photolithography, it was possible to pack approximately 150,000 structures on a 4-inch wafer.

Optical Characterization of Nanogaps

Figure 8A:
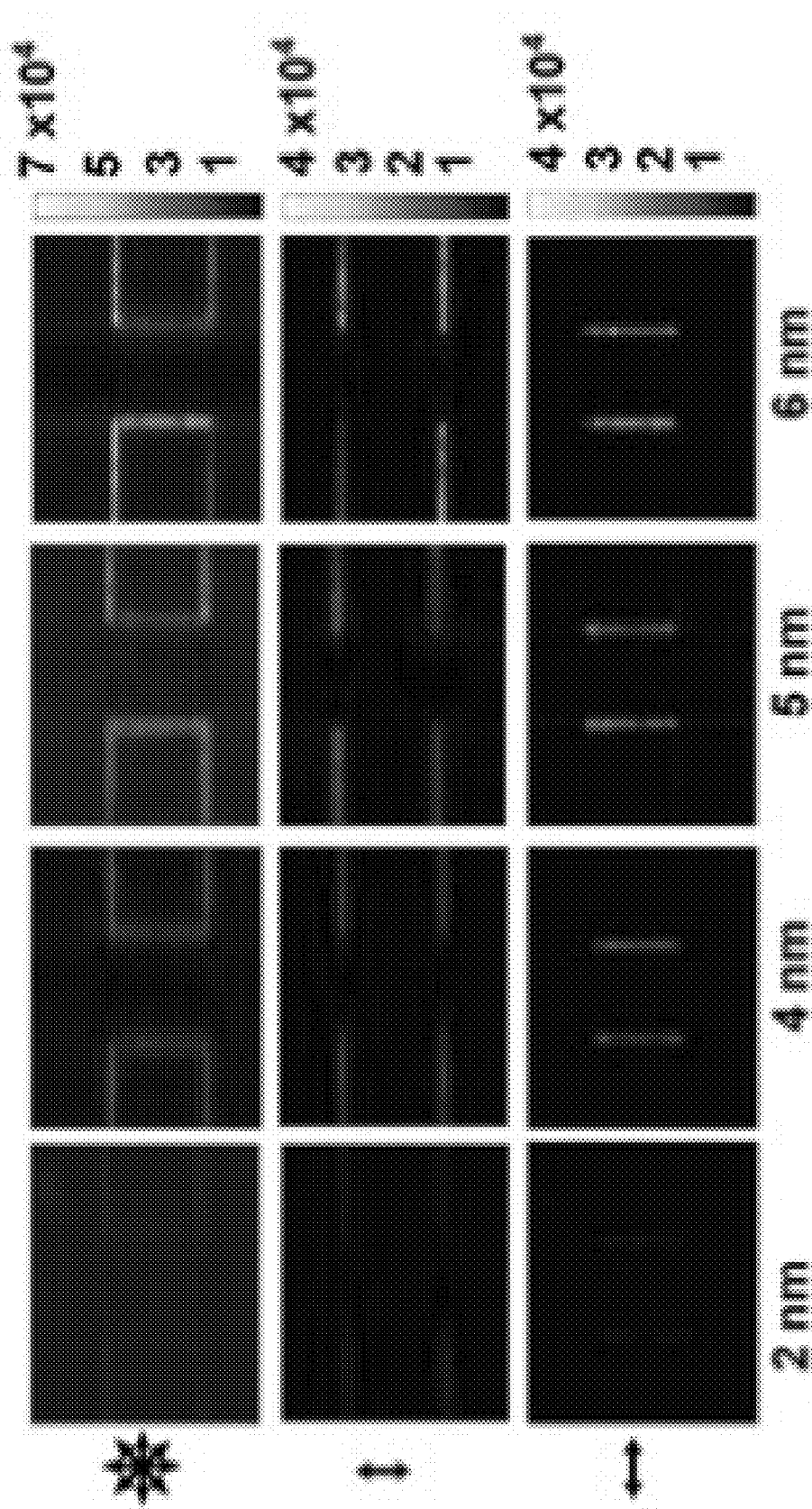
FIG. 8A is an optical micrograph of white-light transmission through $Al_2O_3$-filled nanogaps in 190-nm-thick Ag films. Two adjacent rectangles from the array in FIG. 4H are shown. The illumination is unpolarized (row 1), vertically polarized (row 2) and horizontally polarized (row 3). The widths of the gaps are indicated below each column. The color scale bars on the right show CCD counts.

To prove that uniform nanogaps are formed through the entire film thickness, we measured optical transmission spectra through a series of nanogaps arranged in rectangular loops with varying lateral dimensions in optically thick Au and Ag films (see Methods for experimental details). Since the gaps are oriented vertically, it is straightforward to measure transmission simultaneously through an array of nanogaps simply by imaging the sample under white-light illumination in an optical microscope (FIG. 8A). In this configuration, the nanogaps act as metal-insulator-metal (MIM) waveguides, and only the lowest-order, transverse-magnetic mode in the waveguide is expected to be excited. This mode is excited only by light polarized perpendicular to the gap, as verified experimentally (FIG. 8A).

Figure 8B:
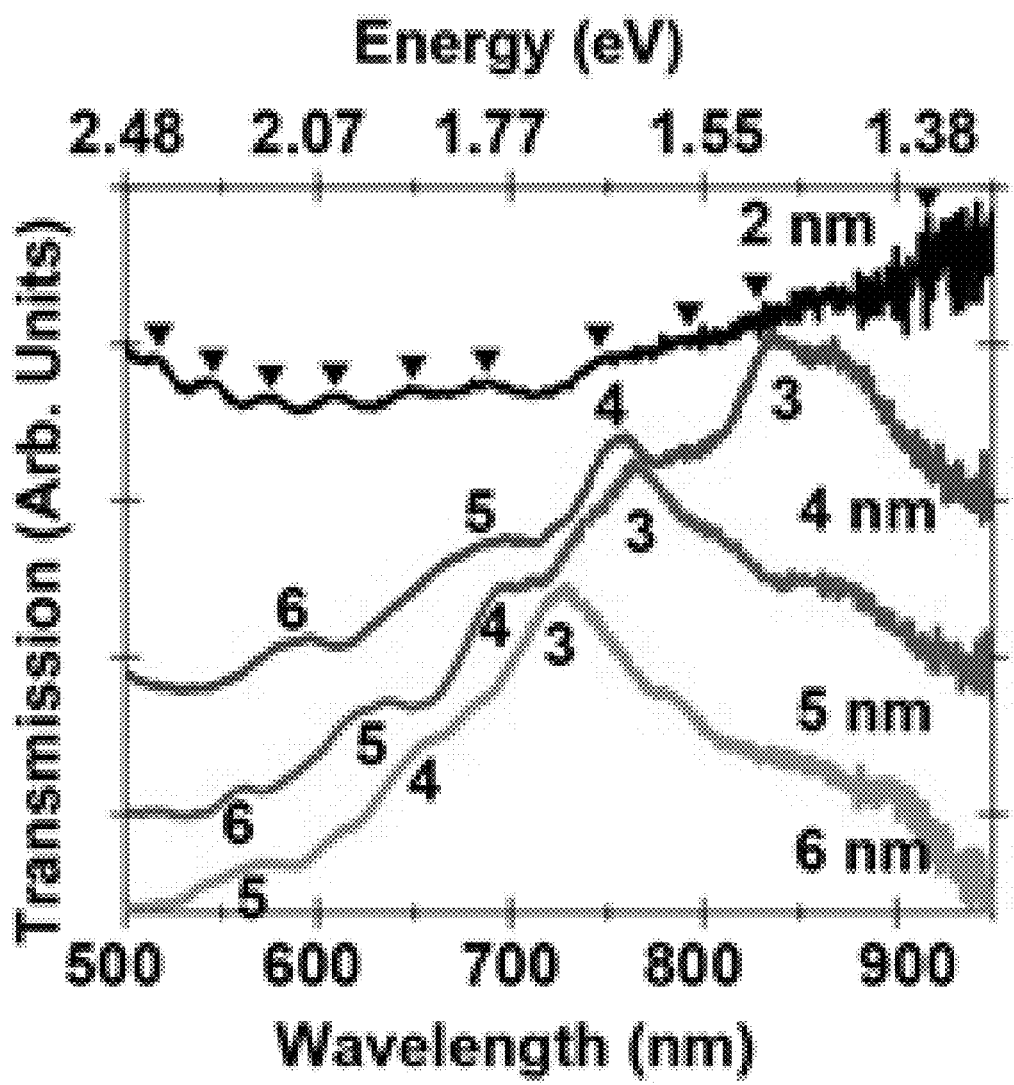
FIG. 8B is a plot of measured transmission spectra through nanogaps in Ag at visible wavelengths.
Figure 8C:
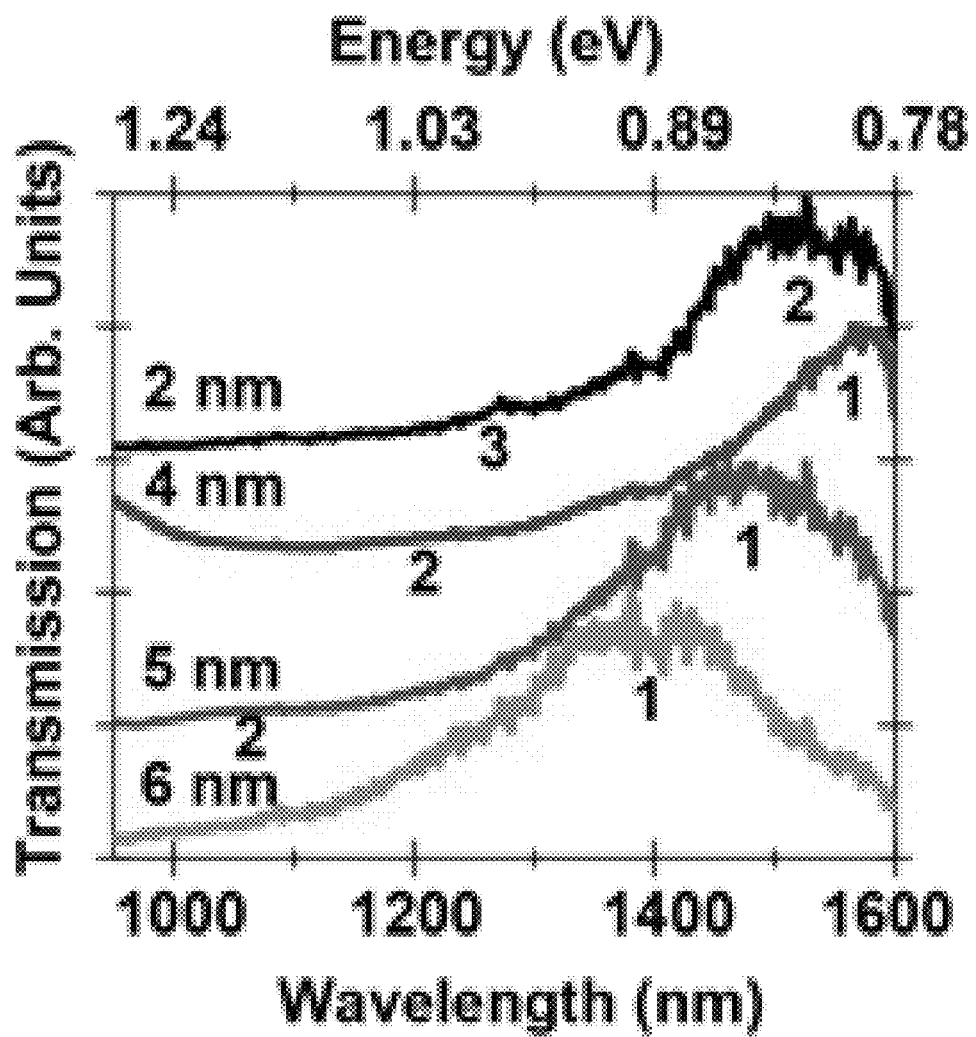
FIG. 8C is a plot of measured transmission spectra through nanogaps in Ag at near-infrared (NIR) wavelengths. Spectra from 2, 4, 5, and 6 nm gaps in FIGS. 8B, C are offset vertically for ease of comparison.
Figure 8D:
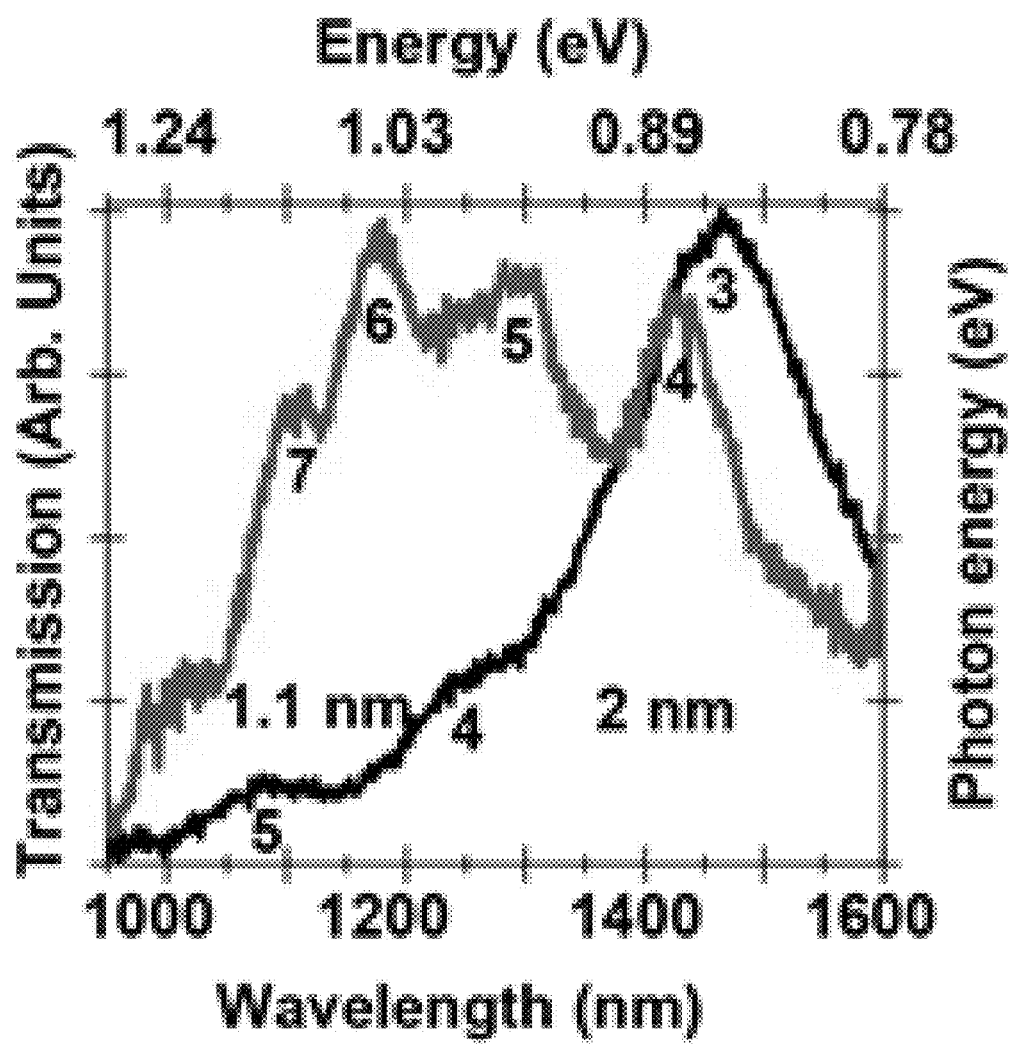
FIG. 8D is a plot of measured transmission spectra at NIR wavelengths through a 1.1 nm gap in a 190-nm-thick Au film and a 2-nm gap in a 200-nm-thick Au film. Numbers in FIGS. 8B-D are the mode orders of Fabry-Pérot resonances in the nanogap waveguides. Triangles in B indicate Fabry-Pérot resonance positions for 2-nm gaps; from right to left, modes 4 to 13 are indicated.
Figure 8E:
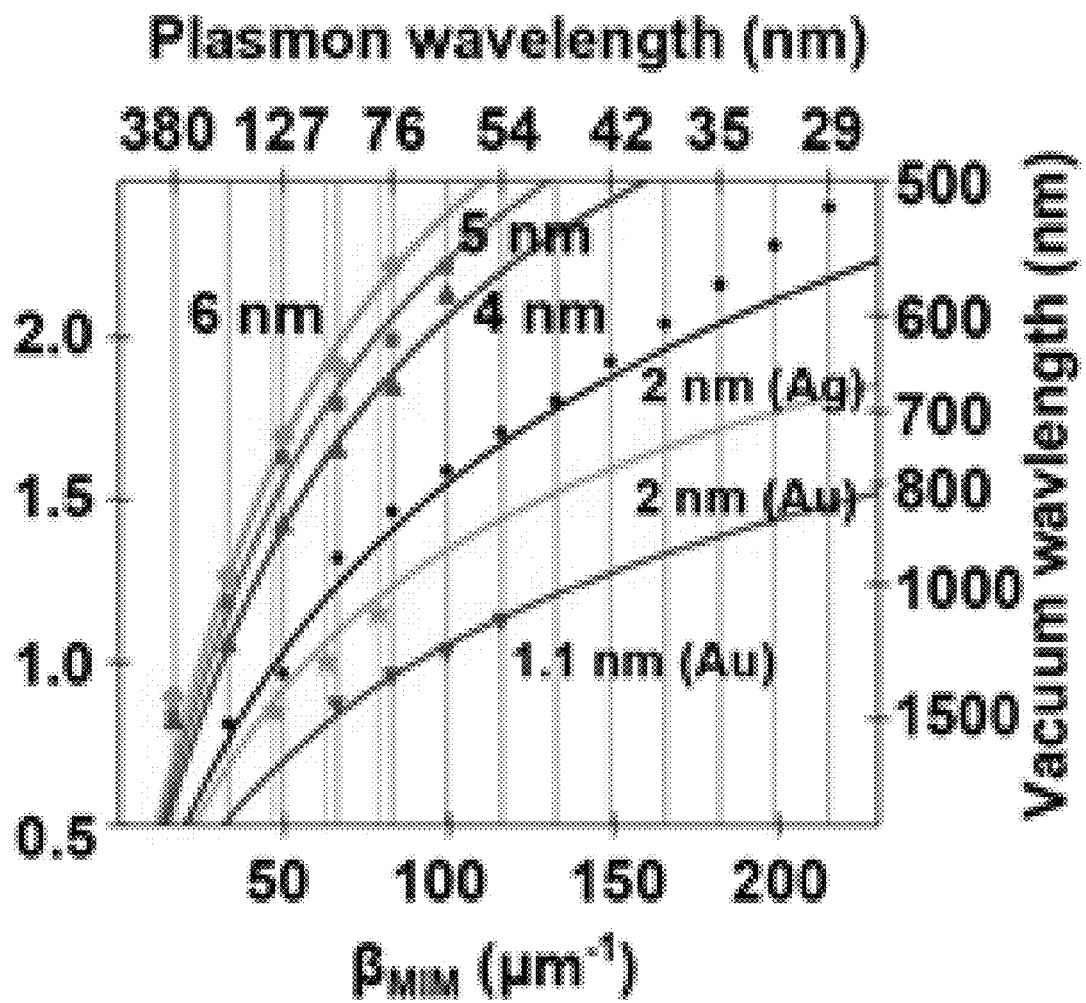
FIG. 8E is a plot of dispersion relations of gap plasmon modes in MIM nanogaps. The solid curves are theoretical dispersion curves for different gap sizes and materials. The markers are measured resonance peaks from MIM nanogap waveguides (FIG. 8B-D). The vertical solid gray grid lines denote the wavenumbers of modes 1 to 13, from left to right, for a cavity length of 190 nm. The vertical dashed gray grids mark the wavenumbers of modes 3, 4, and 5 for a cavity length of 200 nm.

The spectra of light transmitted through the nanogaps show a series of peaks at visible and near-infrared (NIR) wavelengths (FIGS. 8B-D), which correspond to Fabry-Pérot (FP) resonances: light traveling in the MIM waveguide is partially reflected at the upper and lower surfaces of the metal film, forming a resonator whose length, L, is determined by the film thickness. The mode number was determined by comparing the measured data to finite-difference time-domain (FDTD) simulations (not shown), and resonance peak positions were obtained by fitting Lorentzian peaks to the measured spectra. As shown in FIG. 8E, experimental data from the Au and Ag nanogaps are in good agreement with theoretical dispersion relations; deviations for large wavenumbers may be due to the neglect of the phase shifts upon reflection, or due to errors or variations in the measured thickness of the metal film. The dispersion curves indicate that light with a free-space wavelength of 517 nm, when confined to a 2-nm $Al_2O_3$ gap in Ag, takes on a plasmon wavelength $\lambda_{SP}=29$ nm; this corresponds to an effective refractive index of 17.8, the highest index yet reported in the visible spectral range.

C. Discussion

We have presented a simple patterning method—atomic layer lithography—based on standard photolithography, ALD, and adhesive tape, that enables wafer-scale production of 1-nm nanogap arrays containing approximately 150,000 devices. NIR waves pass through gaps with dimensions as much as 1295 times smaller than the free-space wavelength, and we measure an effective refractive index at visible frequencies as high as 17.8. Our method has the unique ability to produce nanometer-scale gaps over millimeter-scale contours, enabling resonantly enhanced transmission of visible, IR or THz waves through opaque metal films. Because the measured transmission passes exclusively through the nano gaps, we can separate light transmitted through the nanogaps from the illumination background even for millimeter-sized beam spots. Pushing the gap dimension towards the Ångstrom scale may become feasible; this would enable wafer-scale investigation of quantum-mechanical and nonlocal effects at optical frequencies, optical rectification, and inelastic electron tunneling excitation of plasmons. Furthermore, by inserting molecules, nanoparticles, or optically active materials in vertically-oriented nanogaps, one could dramatically enhance lightmatter interactions over a wide spectral range, enabling a new generation of IR or THz detectors, and leading to novel nonlinear phenomena.

Example 2

A. Methods

Atomic Layer Deposition.

An $Al_2O_3$ layer was deposited by ALD at 250° C. on Au substrates. Trimethylaluminum and water vapor were sequentially pulsed through the chamber with $N_2$ purging after each injection. Deposition rates were 1.1 Å per cycle on Au. The thickness of the $Al_2O_3$ film was calibrated using ellipsometry on control wafers placed in the same chamber.

FTIR Instrument and Measurement.

The instrument used for mid infrared absorption measurement is Nicolet Series II Magna-IR System 750 FTIR equipped with a microscope (15× IR objective lens, NA=0.58) in the reflection mode. All the data from the nanogap cavity are taken using the microscope with a liquid nitrogen cooled MCT-A (Mercury zinc telluride alloy) detector. The spectrometer and the microscope were purged with dry air. The sample and the light path from the objective lens to the sample are exposed in atmosphere. An adjustable built-in aperture in the IR microscope is used to define the illumination spot size, which is set around 130 um by 130 um. Each absorbance spectrum from the nanogap cavity is normalized to the signal taken from bare silver hundreds of micros away from the patterned area using the same aperture size, and is averaged for 256 times with a resolution of 4 $cm^{-1}$ in each spectrum. We measured absorbance spectrum (defined as $Log_{10}(I_o/I)$ from nanogap samples, where $I_o$ is reflected signal from a bare silver surface as a reference and I is reflected signal from nanogap cavities.

B. Results

Wafer-Scale Atomic Layer Lithography of Nanogaps

The processing scheme employed in this example is illustrated in FIG. 2, discussed above. First, stripes of metal (gold) with the desired geometries (element 10 in FIG. 2) were patterned in a silicon substrate using standard patterning techniques, metal deposition and lift off. The patterned substrate was then coated conformally with $Al_2O_3$ via ALD at a typical growth rate of 1-2 Å per cycle. The metal stripes and substrate overcoated with the $Al_2O_3$ film were subsequently covered with metal (silver) by conformal evaporation (element 40 shown in FIG. 2). After second metal deposition, the UV cured epoxy (NOA 61, Norland Products Inc., element 80 shown in FIG. 2) was then applied on sample surface to glue the sample with a glass slides as backing layer. After curing under UV light for 15 minutes and on a hotplate at 55° C. for overnight, the whole pattern including two metal layers and alumina in-between were stripped off from the silicon wafer.

Figure 9:
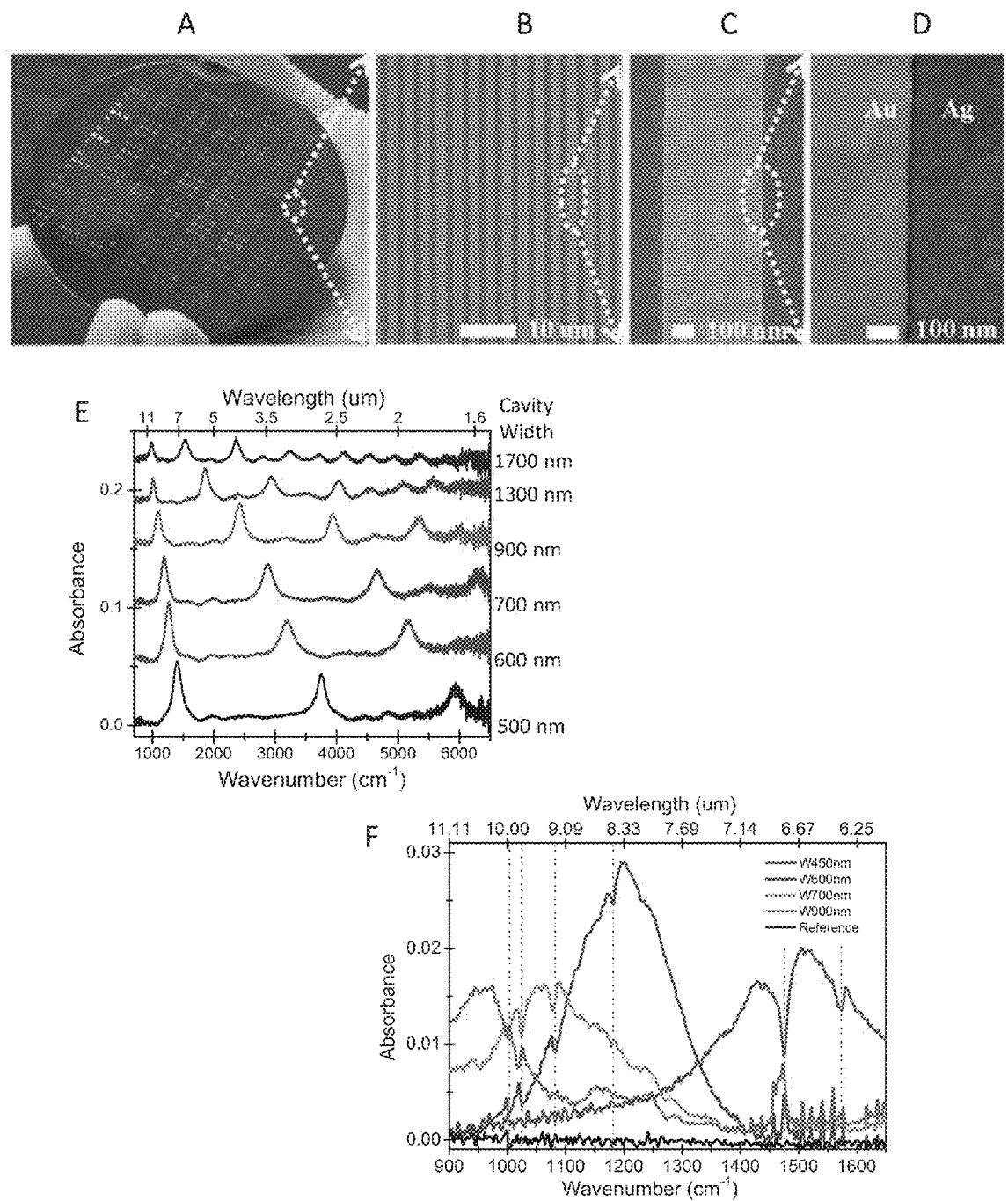
FIG. 9A is a photograph of a wafer containing nanogap arrays made in accordance with an embodiment described herein. Each square is approximately 1.5 mm by 1.5 mm in size.
FIGS. 9B-D are SEMs showing zoomed images (relative to the SEM images in FIG. 9A) of an array of nanogap on the wafer (FIGS. 9C-D) showing a single nanogap cavity and 5 nm nanogap on one side of the cavity between silver and gold.
FIG. 9E is a plot of FTIR spectra from 3 nm gap cavities in 2D stripe pattern with different metal stripe width from 500 nm to 1700 nm.
FIG. 9F is a plot depicting sensing of benzenethiol ("BZT") molecules using 3-nm-wide nanogap with different metal stripe widths. The reference curve is the absorption of BZT coated on a flat silver film. At nearly normal incidence, the absorption from BZT on the flat silver film is below noise level and cannot be detected, while BZT coated on nanogap substrates exhibit substantially higher absorption. The vertical dashed lines in the figure indicate the absorption bands of BZT.

FIG. 9A is a photograph of a wafer containing nanogap arrays. Each square is approximately 1.5 mm by 1.5 mm in size. FIGS. 9B-D are scanning electron micrographs (SEM) of 5-nm-thick gaps buried in silver and gold films. The yield of the stripping process for a wafer-scale array of metal/$Al_2O_3$/metal nanogap structures is nearly 100%. The nanogaps are formed on the planar region as well as sidewalls of metal patterns, naturally folding the entrance and exit segments of the cavity vertically. The resulting cavity geometry facilitates coupling of normally incident light in and out of the cavity. Furthermore, the buried cavity geometry, wherein the patterned metals are tightly embedded in the surrounding metal films, are mechanically robust against wet processing and exhibit planarized top surfaces to facilitate subsequent integration with other devices and microfluidics. Because a dense array of vertically oriented nanogaps can be fabricated using photolithography over an entire 4-inch wafer, our technique will facilitate broader applications of surface-enhanced infrared spectroscopy.

Mid Infrared Characterization of Nanogaps

We measured absorbance spectra from nanogap cavities with metal stripe width of 500, 600, 700, 900, 1300, and 1700 nm, each with gap sizes of 3, 5, 7, and 10 nm. The gold film thickness is fixed at 80 nm for all of the samples. FIG. 9E shows the spectra measured from 3-nm gap structures, with different cavity lengths. Multiple Fabry-Pérot (FP) resonances are observed at wavelengths between 10 μm to 1.6 μm. Besides 2D cavities formed around long metal stripes, the method can also make buried 3D nanogap cavities such as disks. Similar FP resonances are also observed in disk-shaped nanocavities (data not shown).

The peaks observed in the spectra show in FIG. 9E correspond to the FP resonances in the MIM cavity. Similar to Example 1, in the folded MIM nanogap, the gap plasmon follows the dispersion as if it was propagating in an unfolded nanogap cavity. The dispersion curves indicate that light with a free-space wavelength of 10.2 um is confined to a 3-nm $Al_2O_3$ gap in Ag and Au, which corresponds to squeezing light into a gap only 1/3387 of the light wavelength. And simply by tuning the cavity length, we can move the resonances from the mid infrared to the near infrared.

After mapping the resonances of the nanocavity structures, we coated the exposed surfaces of the cavities with a monolayer of benzenethiol (BZT) molecules to perform nanogap-enhanced IR absorption spectroscopy. BZT molecules are placed inside the gap region, which is initially filled with the $Al_2O_3$ film, to utilize the strongest field at the top of nanogap outlets. To accomplish this, Buffered Oxide Etch (BOE) is used to partially remove alumina inside the nanogap. After cleaning with DI water and drying with a nitrogen gun, the sample is soaked in 2 mM benzenethiol solution in ethanol for 24 hours to coat the exposed gold and silver surfaces with a monolayer of BZT. Excess BZT is removed by cleaning with ethanol. The spectra from BZT-coated samples are then measured by FTIR (FIG. 9F). By tuning the width of the metal stripe, the resonance appears at different positions. Increasing the metal stripe width from 450 nm to 900 nm, the resonances cover the BZT absorption bands. We observe six absorption bands in the mid-IR for BZT that are in the range of resonances of our nanogap structures: 1000, 1022, 1073, 1181, 1473, and 1575 $cm^{-1}$, and the absorption bands are strongly coupled to gap plasmon via Fano coupling, which give an enhancement factor as high as $10^5$.

Mid Infrared Broadband Resonator

Figures 10A, 10B:
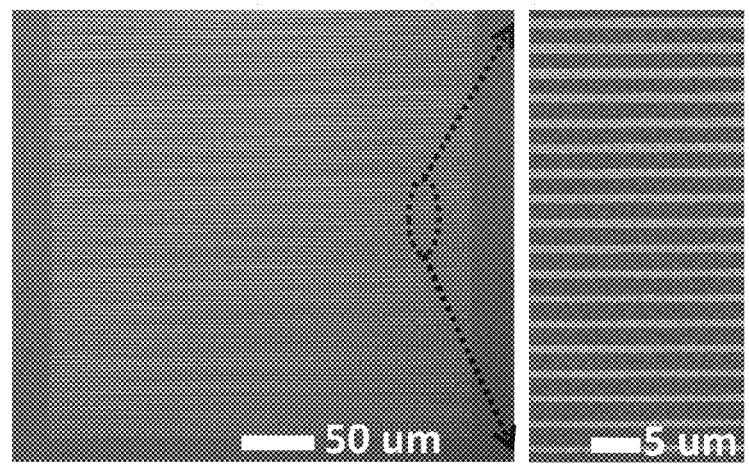
FIG. 10A-B are SEMs of 3 nm nanogap cavity with different metal stripe widths. The zoomed-in image (FIG. 10B) shows one section of the device wherein the metal stripe width increasing from 500 nm (bottom) to 1010 nm (top).
Figure 10C:
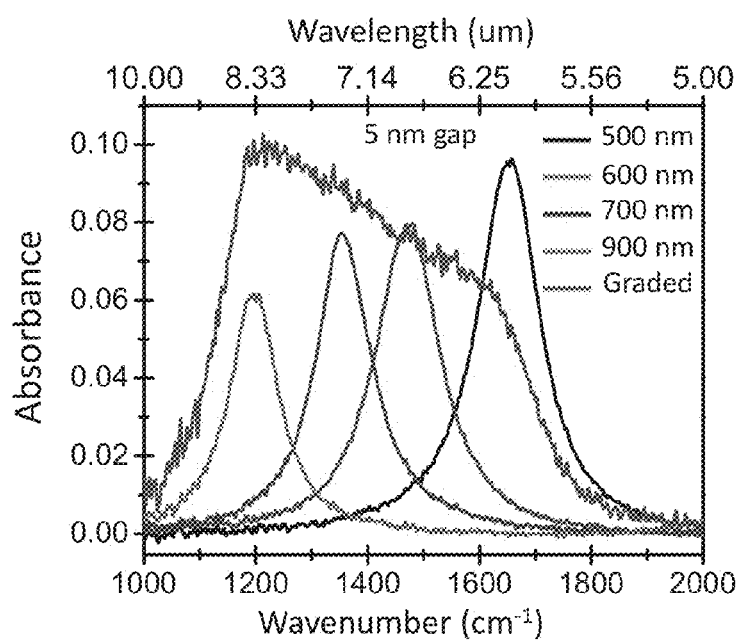
FIG. 10C is a plot of FTIR spectra (purple line) from nanogap cavity with metal stripe width change from 500 nm to 1010 nm with 30 nm interval on a single device (multiplied by 4 for comparison). Spectra from 5 nm gap with single width (500, 600, 700, and 900 nm) on one device (black, red, blue, and pink line), respectively, are plotted in the same figure. The spectra were measured from an area about 130 um by 130 um, and covered around two identical arrays of the graded nanogap structure in FIG. 10A.

The resonance position of the first FP mode from each nanocavity is tunable between 10 μm to 5 μm by simply changing the width of the metal stripe from 500 nm to 1700 nm, with a measured spectral linewidth less than 1 μm. By combing nanogap cavities with different cavity lengths, we create a plasmonic resonator that covers a broad spectral region of the mid-IR fingerprint region. As shown in FIGS. 10A-B, we made a device with metal stripe width gradually changing cavity width from 500 nm to 1010 nm with a 30 nm interval. The spectrum from the laterally graded cavity resonator is shown in FIG. 10C. Resonances from nanogap cavity with metal stripe width of 500, 600, 700, 900 and 1300 nm are also plotted in the same figure. The device with laterally graded nanocavities possesses a resonance that is 5-6 times wider than the resonance of nanocavity with single cavity length.

C. Discussion

We have utilized ALD and template stripping to fabricate buried plasmonic nanocavity arrays at the wafer scale with the minimum gap size of 3 nm. These structures can generate intense gap plasmons that can boost near-field coupling of mid-IR radiation with molecules situated in the vicinity of the gaps, and enhance IR absorption by approximately 5 orders of magnitude. Because the hotspots of each nanocavity uniformly extend along millimeter-long or centimeter-long lines, the resulting structures are practical for sensing applications. Furthermore, since the Au and Ag structures are electrically isolated by the $Al_2O_3$ layer, bias can be applied across the nanogap to trap molecules and for applications based on electron tunneling, and light emission.

The invention claimed is:

1. A method comprising:
providing a patterned substrate having a substrate layer and a first feature disposed on the substrate, the first feature having a side extending from the substrate layer, wherein the substrate layer is exposed adjacent the side of the first feature;
depositing a first layer of material by conformal deposition on the first feature and the exposed substrate layer to produce a coated patterned substrate, wherein the side of the first feature is coated with the material at a thickness on a nanoscale or less;
depositing a layer of a metal on the coated patterned substrate such that the metal is deposited on the coated first feature and the coated substrate layer such that the metal is separated from the first feature by the coated material having the nanoscale or less thickness; and
exposing at least a portion of the first layer of material by (i) removing the deposited metal from the coated feature to expose the first layer deposited on the first feature, or (ii) removing the substrate from the first feature.

2. The method of claim 1, wherein
a portion of the deposited metal is removed from the coated feature such that the remaining portion of the deposited metal remains on the coated substrate portion adjacent the side of the first feature.

3. The method of claim 1,
wherein the first feature is one of a plurality of spaced apart features disposed on the substrate layer, wherein each of the plurality of spaced apart features extend from the substrate layer and form sides, wherein the substrate layer is exposed between the plurality of features;
wherein depositing the first layer of material by conformal deposition results in a coated patterned substrate in which the material is deposited on the plurality of spaced apart features and the exposed substrate layer and wherein the sides of the features are coated with the material at a thickness on a nanoscale or less;
wherein depositing the layer of the metal on the coated patterned substrate results in the deposited metal being deposited on the coated features and the coated substrate layer such that the metal is separated from one or more of the plurality of features by the coated material having the nanoscale or less thickness; and
further comprising removing the deposited metal from the coated features such that the deposited metal remains on the coated substrate portion between the features.

4. The method of claim 3, wherein removing the deposited metal from the coated features comprises:
contacting the metal deposited on the coated features with an adhesive strip to adhere the metal deposited on the coated features to the adhesive strip; and
peeling the metal deposited on the coated features from the coated features.

5. The method of claim 1,
wherein the first feature is one of a plurality of spaced apart features disposed on the substrate layer, wherein each of the plurality of spaced apart features extend from the substrate layer and form sides, wherein the substrate layer is exposed between the plurality of features;
wherein depositing the first layer of material by conformal deposition results in a coated patterned substrate in which the material is deposited on the plurality of spaced apart features and the exposed substrate layer and wherein the sides of the features are coated with the material at a thickness on a nanoscale or less;
wherein depositing the layer of the metal on the coated patterned substrate results in the deposited metal being deposited on the coated features and the coated substrate layer such that the metal is separated from one or more of the plurality of features by the coated material having the nanoscale or less thickness; and
further comprising:
bonding a second substrate to the deposited layer of metal; and
removing the substrate layer from the plurality of spaced apart features, resulting in an article comprising the second substrate, the deposited layer of metal, at least a portion of the layer deposited by conformal deposition, and the plurality of spaced apart features, wherein the second substrate is bonded to the deposited layer of metal, and wherein the layer deposited by conformal deposition is disposed between the plurality of spaced apart features and the deposited layer of metal.

6. The method of claim 1,
wherein the first feature is a layer disposed on the substrate layer, wherein the feature layer defines a void that forms the side of the first feature, wherein the substrate layer is exposed through the void of the feature layer;
wherein depositing the first layer of material by conformal deposition on the patterned substrate results in the coated patterned substrate in which the layer of material is deposited on the exposed first substrate layer and the feature layer, wherein the layer of material deposited by conformal deposition has a thickness on the side of the first feature of a nanoscale or less;
wherein depositing the layer of the metal on the coated patterned substrate results in the deposited metal being deposited on the coated feature layer and the coated substrate layer such that the metal is separated from the feature layer by the coated material having the nanoscale or less thickness; and
further comprising:
bonding a second substrate to the deposited layer of metal; and
removing the substrate layer from the feature layer and the layer deposited on the patterned substrate by conformal deposition, resulting in an article comprising the second substrate, the deposited layer of metal, the layer deposited by conformal deposition, and the feature layer, wherein the second substrate is bonded to the deposited layer of metal, and wherein the layer deposited by conformal deposition is in contact with a first major surface of the feature layer, is exposed along at least a portion of an opposing second major surface of the feature layer, and is disposed between the feature layer and the deposited layer of metal.

7. The method of claim 1, wherein depositing the first layer of material by conformal deposition comprises depositing the material as a layer having a thickness of about 10 nm or less.

8. The method of claim 1, wherein depositing the first layer of material by conformal deposition comprises depositing the material by atomic layer deposition.

9. The method of claim 1, wherein the first feature is formed from conductive material.

10. The method of claim 9, wherein the conductive material comprises one or more of ruthenium, rhodium, palladium, silver, osmium, iridium, platinum, gold, copper, tungsten, molybdenum, and aluminum.

11. The method of claim 9, wherein the conductive material is selected from the group consisting of gold and silver.

12. The method of claim 1, wherein depositing the first layer of material by conformal deposition comprises depositing a layer of insulating material.

13. The method of claim 12, wherein the insulating material comprises a metal oxide.

14. The method of claim 12, wherein the insulating material comprises $Al_2O_3$, ZnO, $TiO_2$, $HfO_2$, or $SiO_2$.

15. The method of claim 1, wherein depositing the layer of the metal on the coated patterned substrate comprises depositing a layer of a noble metal on the coated patterned substrate.

16. The method of claim 1, wherein depositing the layer of the metal on the coated patterned substrate comprises depositing the metal by a metal evaporation deposition process.

17. The method of claim 1, wherein the sides of the plurality of spaced apart features are substantially orthogonal to the substrate layer.

18. The method of claim 1, wherein the deposited metal is removed from the coated feature to expose the first layer on the coated feature.

19. The method of claim 1, wherein the substrate is removed from the first feature to expose the first layer between the first feature and the deposited metal.

* * * * *